(12) United States Patent
Sung et al.

(10) Patent No.: US 11,843,874 B2
(45) Date of Patent: Dec. 12, 2023

(54) ELECTRONIC DEVICE INCLUDING UNDER DISPLAY CAMERA AND OPERATING METHOD THEREOF

(71) Applicant: Samsung Electronics Co., Ltd., Suwon-si (KR)

(72) Inventors: Kisuk Sung, Suwon-si (KR); Saetek Oh, Suwon-si (KR); Jaehyeok Choi, Suwon-si (KR); Sungoh Kim, Suwon-si (KR); Inyong Shim, Suwon-si (KR); Kihuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/994,141

(22) Filed: Nov. 25, 2022

(65) Prior Publication Data
US 2023/0115756 A1    Apr. 13, 2023

Related U.S. Application Data

(63) Continuation of application No. PCT/KR2022/008028, filed on Jun. 7, 2022.

(30) Foreign Application Priority Data

Aug. 10, 2021    (KR) .................... 10-2021-0105671

(51) Int. Cl.
H04N 23/88        (2023.01)
H10K 59/65        (2023.01)
(Continued)

(52) U.S. Cl.
CPC ........... *H04N 23/88* (2023.01); *H04N 23/631* (2023.01); *H04N 23/81* (2023.01); *H04N 23/90* (2023.01);
(Continued)

(58) Field of Classification Search
CPC ........ H04N 23/45; H04N 23/50; H04N 23/51; H04N 23/54; H04N 23/55; H04N 23/57;
(Continued)

(56) References Cited

U.S. PATENT DOCUMENTS 8,994,714 B2    3/2015  Erinjippurath et al.
10,616,478 B2    4/2020  Jung et al.
(Continued)

FOREIGN PATENT DOCUMENTS

CN    107995429 A    5/2018
CN    110769151 A    2/2020
(Continued)

OTHER PUBLICATIONS

International Search Report with Written Opinion and English translation dated Sep. 15, 2022; International Appln. No. PCT/KR2022/008028.

*Primary Examiner* — Anthony J Daniels
(74) *Attorney, Agent, or Firm* — Jefferson IP Law, LLP

(57) ABSTRACT

An electronic device is provided. The electronic device includes a first camera, a display, a second camera disposed below the display, and at least one processor, wherein the at least one processor is configured to acquire first image data and first environment information associated with the first image data by using the first camera, acquire second image data and second environment information associated with the second image data by using the second camera, determine whether to correct a correction value related to the second camera based on the second image data, the correction value including at least one of a white balance correction value for correcting white balance of the second camera or a lens shading correction value for correcting lens shading of the second camera, identify a similarity between the first environment information and the second environment information in response to determining to correct the correction
(Continued)

value related to the second camera, and correct the correction value related to the second camera by using at least the similarity based on the first image data.

23 Claims, 15 Drawing Sheets

(51) Int. Cl.
 *H04N 23/90* (2023.01)
 *H04N 23/63* (2023.01)
 *H04N 23/81* (2023.01)
 *H10K 59/60* (2023.01)

(52) U.S. Cl.
 CPC ......... *G09G 2360/14* (2013.01); *H10K 59/60* (2023.02); *H10K 59/65* (2023.02)

(58) Field of Classification Search
 CPC ......... H04N 23/631–633; H04N 23/84; H04N 23/88; H04N 9/73; H04N 9/735; G09G 2360/14
 USPC ...................................................... 348/223.1
 See application file for complete search history.

(56) References Cited

U.S. PATENT DOCUMENTS

| | | | |
|---|---|---|---|
| 10,645,282 | B2 | 5/2020 | An et al. |
| 10,694,126 | B2 | 6/2020 | Lee et al. |
| 11,132,979 | B2 | 9/2021 | Lee et al. |
| 2008/0231726 | A1 | 9/2008 | John |
| 2009/0201374 | A1 | 8/2009 | Hung et al. |
| 2014/0211041 | A1* | 7/2014 | McCrackin .......... H04N 23/667 348/223.1 |
| 2021/0152734 | A1 | 5/2021 | Zhou et al. |
| 2021/0195155 | A1 | 6/2021 | Yuan |
| 2021/0297637 | A1* | 9/2021 | Chang .................... H04N 23/84 |
| 2022/0159162 | A1* | 5/2022 | Sun ........................ G06T 5/003 |
| 2022/0201181 | A1 | 6/2022 | Yang |
| 2022/0272246 | A1* | 8/2022 | Verma .................... H04N 23/55 |

FOREIGN PATENT DOCUMENTS

| | | |
|---|---|---|
| CN | 112133197 A | 12/2020 |
| CN | 113014747 A | 6/2021 |
| KR | 10-1154136 B1 | 6/2012 |
| KR | 10-2017-0106177 A | 9/2017 |
| KR | 10-2019-0064958 A | 6/2019 |
| KR | 10-2021-0004472 A | 1/2021 |
| WO | 2021/092887 A1 | 5/2021 |

\* cited by examiner

ELECTRONIC DEVICE INCLUDING UNDER DISPLAY CAMERA AND OPERATING METHOD THEREOF

CROSS-REFERENCE TO RELATED APPLICATION(S)

This application is a continuation application, claiming priority under § 365(c), of an International application No. PCT/KR2022/008028, filed on Jun. 7, 2022, which is based on and claims the benefit of a Korean patent application number 10-2021-0105671, filed on Aug. 10, 2021, in the Korean Intellectual Property Office, the disclosure of which is incorporated by reference herein in its entirety.

TECHNICAL FIELD

The disclosure relates to a technology for improving the quality of images in an electronic device including an under display camera (UDC).

BACKGROUND ART

There have been ongoing efforts to satisfy consumers by increasing the size of a display of mobile devices because the increase in size leads to a more immersive user experience, a higher degree of mobility, and greater consumer satisfaction in terms of design.

Therefore, there has been development of under display camera (UDC) technology such that a front camera is disposed under a display such that the area for the camera can also be used for the display. By employing a UDC, the display area can be increased, and by positioning the front camera in the middle of the screen, a deviation from the user's gaze can be reduced.

The above information is presented as background information only to assist with an understanding of the disclosure. No determination has been made, and no assertion is made, as to whether any of the above might be applicable as prior art with regard to the disclosure.

DISCLOSURE

Technical Problem

An under display camera (UDC) is disposed under a display so as to acquire images regarding light that has passed through the display. However, incident light has a different degree of transmittance through the display with regard to each wavelength. Such a difference in transmittance of light incident onto the UDC with regard to each wavelength results in a difference between the image captured by the UDC and the actually photographed scene.

An electronic device of the related art is produced through a calibration process performed after assembling a camera module used as a UDC and a display, in order to reduce the difference between images captured through the UDC and the actual scenes. That is, in the electronic device production phase, a calibration process is performed to generate and store a correction value such that, while the camera module and the display remain coupled to each other, problems caused by light incident onto the UDC can be addressed. This approach has a problem in that, if some components included in the electronic device (for example, a display and camera module) are replaced, the calibration process needs to be performed again.

Aspects of the disclosure are to address at least the above-mentioned problems and/or disadvantages and to provide at least the advantages described below. Accordingly, an aspect of the disclosure is to provide a technology for improving the quality of images in an electronic device including a UDC.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first camera, a display, a second camera disposed below the display can configured to acquire an image of light passing through the display, and at least one processor electrically connected to the first camera, the display, and the second camera. The at least one processor may acquire first image data and first environment information associated with the first image data by using the first camera, acquire second image data and second environment information associated with the second image data by using the second camera, determine whether to correct a correction value related to the second camera based on the second image data, the correction value including at least one of a white balance correction value for correcting white balance of the second camera or a lens shading correction value for correcting lens shading of the second camera, identify a similarity between the first environment information and the second environment information in response to determining to correct the correction value related to the second camera, and correct the correction value related to the second camera by using at least the similarity based on the first image data.

In accordance with another aspect of the disclosure, a method performed by an electronic device is provided. The method includes acquiring first image data and first environment information associated with the first image data by using a first camera of the electronic device, acquiring second image data and second environment information associated with the second image data by using a second camera of the electronic device that is disposed below a display of the electronic device to acquire an image of light passing through the display, determining whether to correct a correction value related to the second camera based on the second image data, the correction value including at least one of a white balance correction value for correcting white balance of the second camera or a lens shading correction value for correcting lens shading of the second camera, determining whether a similarity between the first environment information and the second environment information is equal to or greater than a designated value in response to determining to correct the correction value related to the second camera, and correcting the correction value related to the second camera based on the first image data by using at least the similarity in response to determining that the similarity is equal to or greater than the designated value.

In accordance with another aspect of the disclosure, an electronic device is provided. The electronic device includes a first camera, a display, a second camera disposed below the display and configured to acquire an image of light passing through the display, and at least one processor electrically connected to the first camera, the display, and the second camera. The at least one processor may acquire an image frame by using the second camera, determine whether to correct a correction value related to the second camera based on the image frame, the correction value including at least one of a white balance correction value for correcting white balance of the second camera or a lens shading correction value for correcting lens shading of the second camera, display a user interface (UI) associated with the correction of the correction value on the display in response to determining to correct the correction value, acquire first image data satisfying a designated condition and first environment information associated with the first image data by using the first camera, acquire second image data satisfying a designated condition and second environment information associated with the second image data by using the second camera, and correct the correction value related to the second camera based on a result of comparing the first image data with the second image data.

Advantageous Effects

According to various embodiments disclosed herein, even if the transmittance of light incident onto a under display camera (UDC) is reduced as the same passes through the display, or even if the light has a different transmittance for each wavelength, an electronic device may correct images acquired through the UDC, thereby acquiring images with improved qualities. Moreover, based on a feedback using an image acquired through the UDC, the electronic device of the disclosure may update a correction value for correcting the image while the user uses the electronic device even if no calibration process is performed in the production phase.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalent.

It is to be understood that the singular forms "a," "an," and "the" include plural referents unless the context clearly dictates otherwise. Thus, for example, reference to "a component surface" includes reference to one or more of such surfaces.

Figure 1:
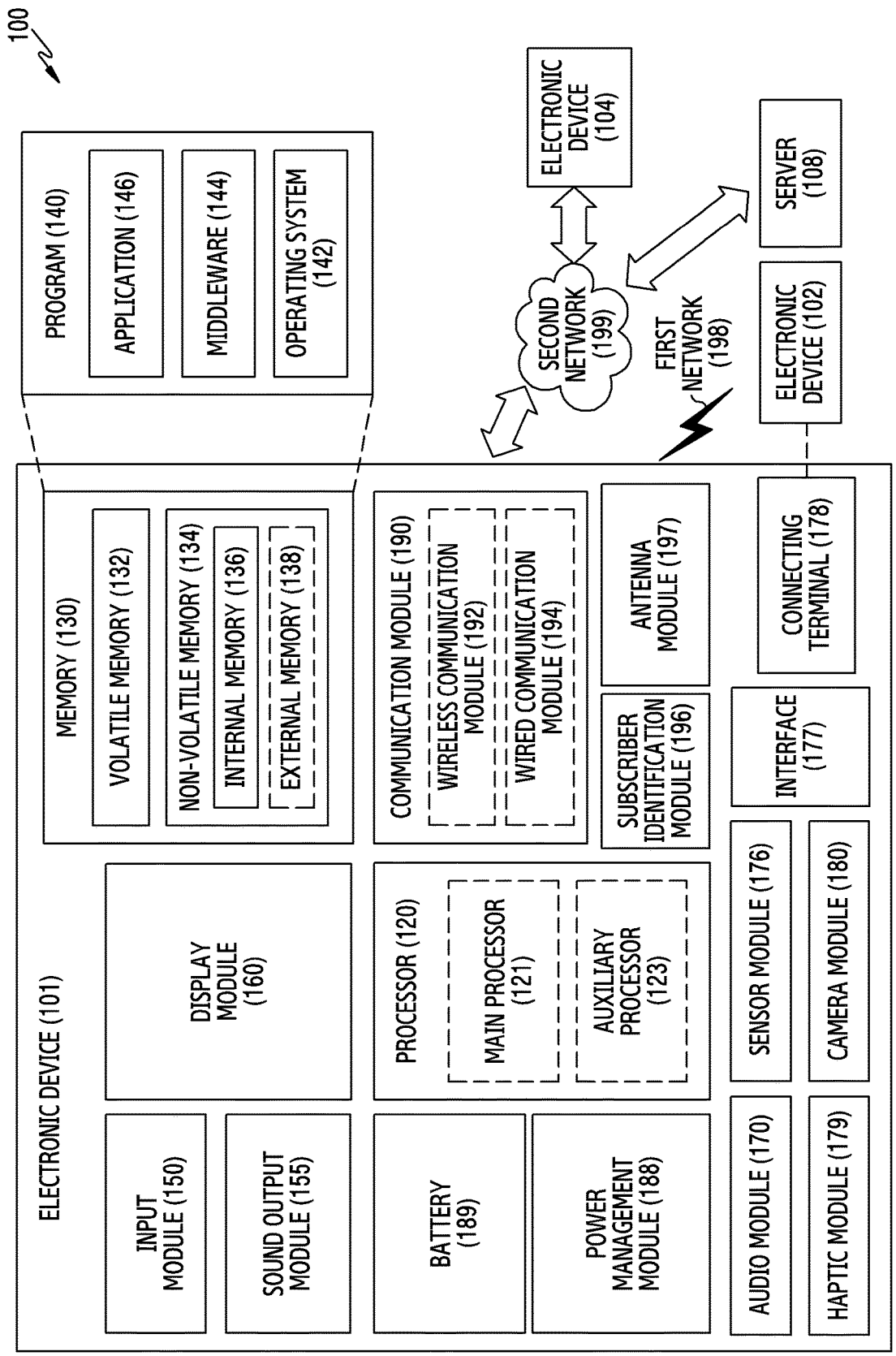
FIG. 1 is a block diagram illustrating an electronic device in a network environment according to an embodiment of the disclosure.

FIG. 1 is a block diagram illustrating an electronic device 101 in a network environment 100 according to an embodiment of the disclosure. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
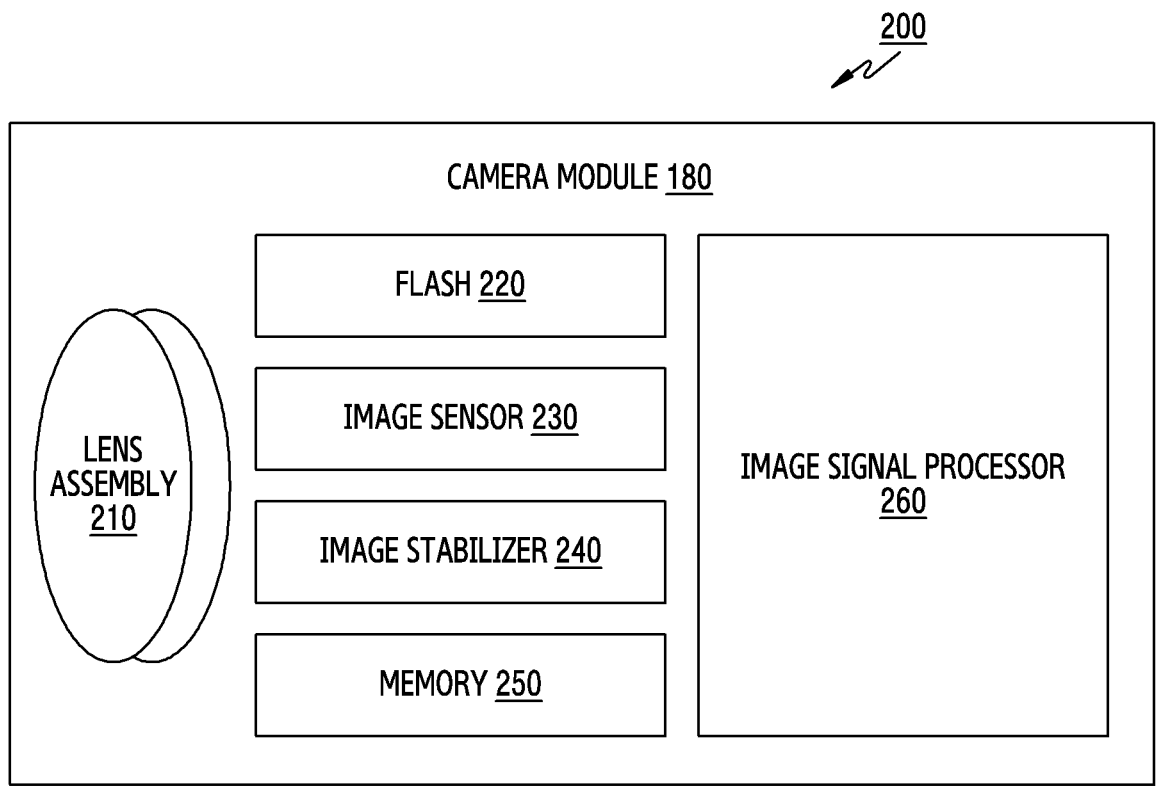
FIG. 2 is a block diagram illustrating a camera module according to an embodiment of the disclosure.

FIG. 2 is a block diagram 200 illustrating the camera module 180 according to an embodiment of the disclosure. Referring to FIG. 2, the camera module 180 may include a lens assembly 210, a flash 220, an image sensor 230, an image stabilizer 240, memory 250 (e.g., buffer memory), or an image signal processor 260. The lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light reflected from an object. According to an embodiment, the flash 220 may include one or more light emitting diodes (LEDs) (e.g., a red-green-blue (RGB) LED, a white LED, an infrared (IR) LED, or an ultraviolet (UV) LED) or a xenon lamp. The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as an RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer. The memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display module 160. Thereafter, if a specified condition is met (e.g., by a user's input or system command), at least part of the raw image stored in the memory 250 may be obtained and processed, for example, by the image signal processor 260. According to an embodiment, the memory 250 may be configured as at least part of the memory 130 or as a separate memory that is operated independently from the memory 130.

The image signal processor 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may perform control (e.g., exposure time control or read-out timing control) with respect to at least one (e.g., the image sensor 230) of the components included in the camera module 180. An image processed by the image signal processor 260 may be stored back in the memory 250 for further processing, or may be provided to an external component (e.g., the memory 130, the display module 160, the electronic device 102, the electronic device 104, or the server 108) outside the camera module 180. According to an embodiment, the image signal processor 260 may be configured as at least part of the processor 120, or as a separate processor that is operated independently from the processor 120. If the image signal processor 260 is configured as a separate processor from the processor 120, at least one image processed by the image signal processor 260 may be displayed, by the processor 120, via the display module 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

Figure 3:
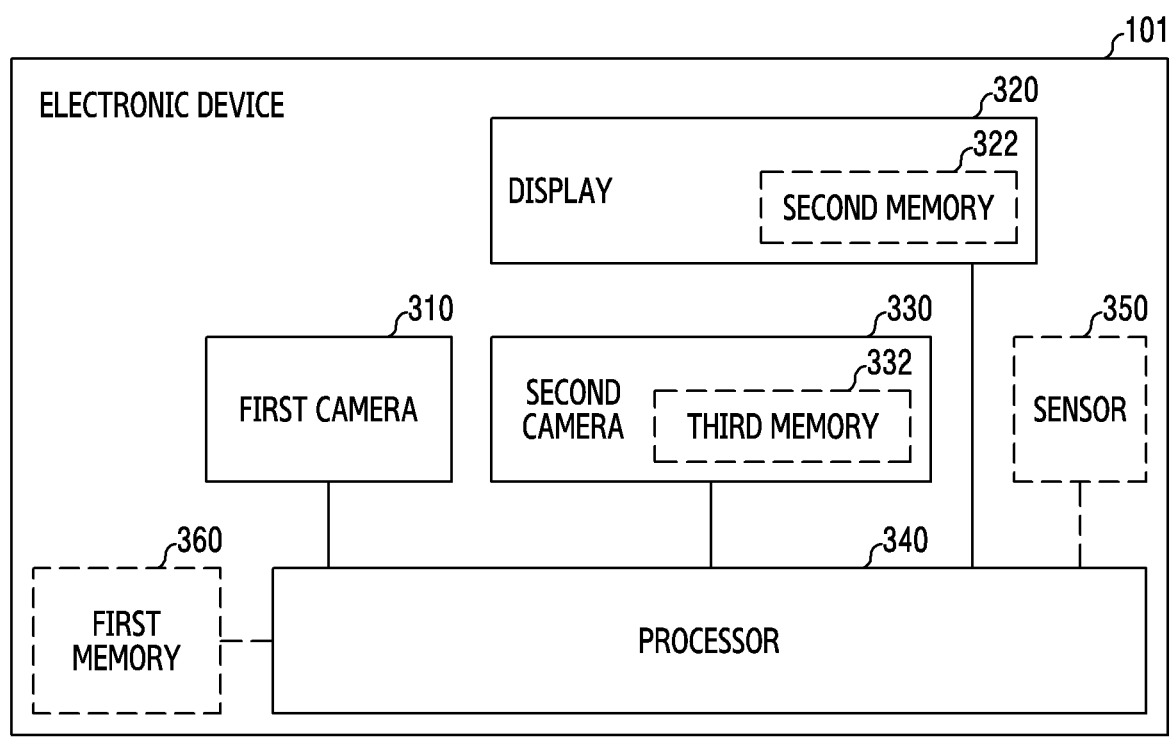
FIG. 3 is a block diagram illustrating a hardware configuration included in an electronic device according to an embodiment of the disclosure.

FIG. 3 is a block diagram illustrating a hardware configuration included in an electronic device according to an embodiment of the disclosure. The electronic device 101 of FIG. 3 may correspond to the electronic device 101 of FIG. 1.

Referring to FIG. 3, the electronic device 101 may include a first camera 310, a display 320, a second camera 330 disposed under the display 320, and a processor 340. The electronic device 101 may further include at least one of a sensor 350 or a first memory 360.

According to an embodiment, the first camera 310 may correspond to the camera module 180 of FIG. 2. The first camera 310 may be disposed on the front surface or rear surface of the electronic device 101 to acquire an image of light incident toward the first camera 310. For example, the first camera 310 may acquire an image of light incident through a cover glass or a window glass.

According to an embodiment, the first camera 310 may acquire first image data and first environment information related to the first image data. According to an embodiment, the processor 340 may acquire the first image data without a user's photographing command related to the first camera 310. For example, the processor 340 may acquire the first image data during a preview operation using the first camera 310 while an application (e.g., a camera application) supporting the first camera 310 is executed. According to an embodiment, the processor 340 may acquire the first environment information related to the first image data by using the first camera 310. For example, the first environment information may include illuminance, brightness, and/or color temperature at a time point at which the first image data is acquired.

According to an embodiment, the display 320 may correspond to the display module 160 of FIG. 1. According to an embodiment, the display 320 may be implemented integrally with the touch panel. The display 320 may support a touch function, may detect a user input (e.g., a touch using a finger), and may transmit the user input to the processor 340. According to an embodiment, the display 320 may be connected to a display driver integrated circuit (DDIC) for driving the display 320, and the touch panel may be connected to a touch IC for detecting touch coordinates and a touch-related algorithm. According to an embodiment, a display driving circuit and the touch IC may be integrally formed. In another embodiment, the display driving circuit and the touch IC may be formed separately. The display driving circuit and/or the touch IC may be electrically connected to the processor 340.

According to an embodiment, an execution screen of an application (e.g., a camera application or a gallery application) executed by the processor 340 may be displayed on the display 320. For example, the processor 340 may display a user interface (UI) on the display 320 while executing the camera application.

According to an embodiment, the display 320 may include a second memory 322. The second memory 322 may be a non-volatile memory. For example, the second memory 322 may be an electrically erasable programmable read only memory (EEPROM). According to an embodiment, the second memory 322 may store transmittance information on a ratio of light passing through the display 320. The processor 340 may obtain the transmittance information from the second memory 322. The transmittance information will be described later with reference to FIGS. 12A and 12B.

According to an embodiment, the second camera 330 may correspond to the camera module 180 of FIG. 2. According to an embodiment, the second camera 330 may be disposed under the display 320 to acquire an image of the light passing through the display 320. For example, the second camera 330 may be an under-display camera (UDC). Since the display 320 may be composed of a larger number of layers compared to the cover glass, an amount of light passing through the display 320 may be less than that of light passing through the cover glass. That is, in the same situation, an amount of light incident on the second camera 330 may be less than that of light incident on the first camera 310. With respect to transmittance, it will be described later with reference to FIG. 4.

According to an embodiment, the second camera 330 may include a third memory 332. The third memory 332 may correspond to the memory 250 of FIG. 2. The third memory 332 may be a non-volatile memory. For example, the third memory 332 may be an EEPROM. According to an embodiment, the third memory 332 may store a configuration value related to the light incident on the second camera 330. The configuration value may be a configuration value associated with light that does not pass through the display 320. The processor 340 may acquire the configuration value from the third memory 332. The configuration value will be described later with reference to FIGS. 12A and 12B.

According to an embodiment, the second camera 330 may acquire second image data and second environment information related to the second image data. For example, the processor 340 may acquire the second image data during a preview operation using the second camera 330 while an application supporting the second camera 330 is being executed. According to an embodiment, the processor 340 may acquire the second environment information related to the second image data by using the second camera 330. For example, the second environment information may include illuminance, brightness, and/or color temperature at a time point at which the second image data is acquired.

According to an embodiment, the processor 340 may correspond to the processor 120 of FIG. 1. The processor 340 may be understood to include at least one processor. For example, the processor 340 may include at least one of an application processor (AP), an image signal processor (ISP) 260, or a communication processor (CP).

According to an embodiment, the sensor 350 may be included in the sensor module 176 of FIG. 1. For example, the sensor 350 may include at least one of an illuminance sensor, an infrared (IR) sensor, or a position sensor. In addition to this, various sensors that can be implemented by a person skilled in the art may be included in the sensor 350.

According to an embodiment, the sensor 350 may acquire first environment information while the first camera 310 acquires the first image data, and may acquire second environment information while the second camera 330 acquires the second image data. The processor 340 may further acquire the first environment information and/or the second environment information using the sensor 350. For example, the first environment information may include at least one of illuminance, the amount of infrared light, and location information (e.g., global positioning system (GPS) information) on the location of the electronic device 101 when the first image data is acquired. In addition, the second environment information may include at least one of illuminance, the amount of infrared light, or location information on the location of the electronic device 101 when the second image data is acquired.

According to an embodiment, the first memory 360 may correspond to the memory 130 of FIG. 1 or may be included in the memory 130 of FIG. 1. According to an embodiment, the first memory 360 may store various programming languages or instructions by the processor 340. For example, the processor 340 may execute an application by executing a code written in a programming language stored in the first memory 360, and may control a variety of hardware. In addition, the processor 340 may execute instructions stored in the first memory 360 to configure and support an appropriate photographing mode so that a camera module (e.g., the first camera 310 and the second camera 330) may perform an operation intended by the user.

According to an embodiment, the first memory 360 may store a correction value related to the second camera 330. Since the second camera 330 acquires an image of the light that has passed through the display 320, the correction value related to the second camera 330 may include a characteristic of the second camera 330 and a characteristic of the display 320. Accordingly, the correction value related to the second camera 330 may be stored in the first memory 360 instead of the third memory 332 included in the second camera 330. According to an embodiment, the processor 340 may apply the correction value stored in the first memory 360 to the second image data obtained from the second camera 330. In addition, when the correction value related to the second camera 330 is corrected, the processor 340 may store the corrected correction value in the first memory 360.

Figure 4:
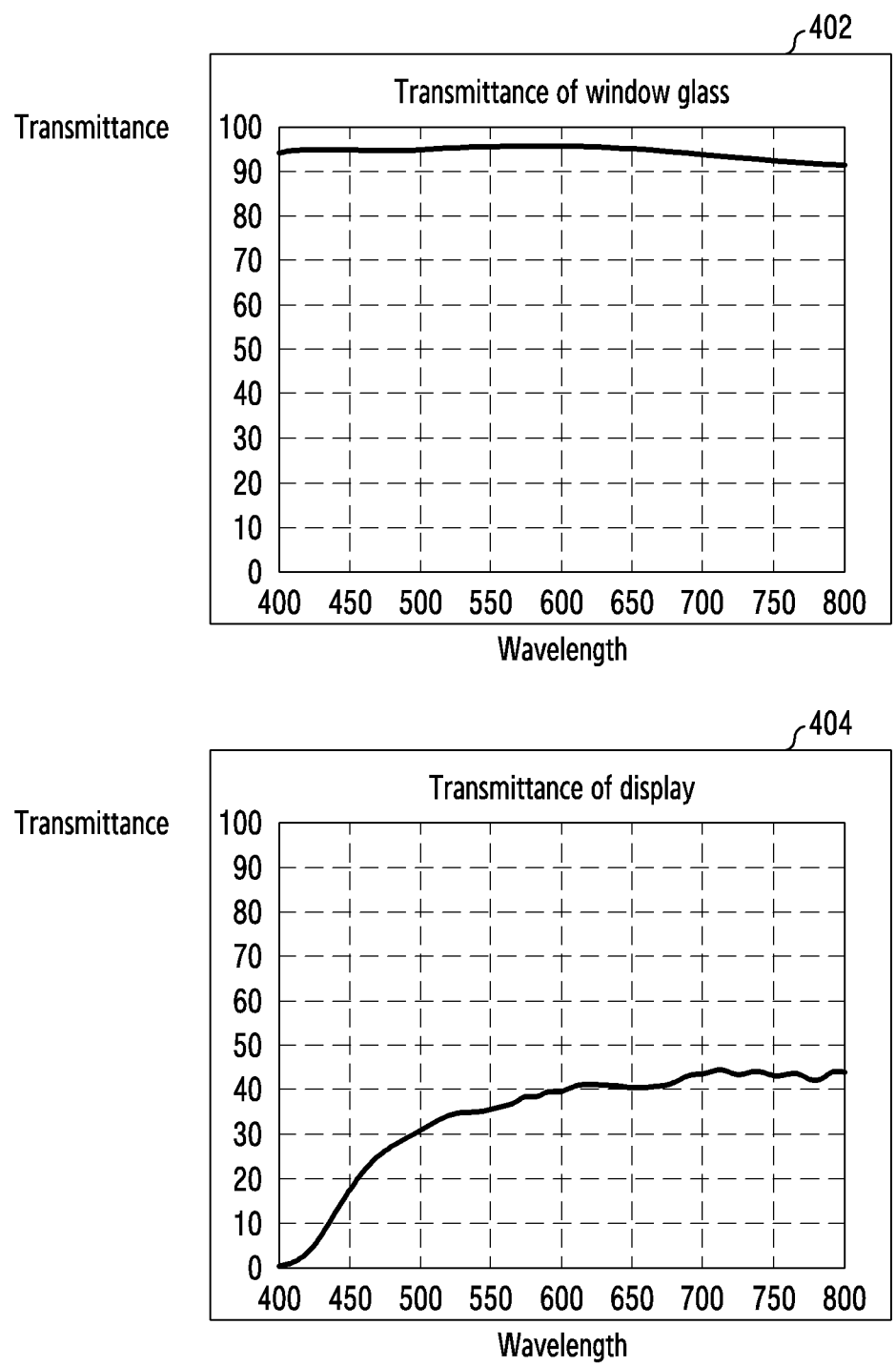
FIG. 4 illustrates transmittance of light incident to a first camera and a second camera, respectively according to an embodiment of the disclosure.

FIG. 4 illustrates transmittance of light incident to the first camera 310 and the second camera 330, respectively, according to an embodiment of the disclosure.

Referring to FIG. 4, a first graph 402 is a graph of transmittance (0% to 100%) for each wavelength (400 nm to 800 nm) of light passing through a window glass, and a second graph 404 is a graph of transmittance (0% to 100%) for each wavelength (400 nm to 800 nm) of light passing through the display 320. FIG. 4 is an example, and transmittances different from those of the first graph 402 and the second graph 404 may be shown.

Referring to the first graph 402 of FIG. 4, the transmittance of light passing through the window glass in a wavelength region of 400 nm to 800 nm is 90% or more, and a constant transmittance in the entire wavelength region is shown. Referring to the second graph 404 of FIG. 4, it can be seen that a ratio at which light having a wavelength of 400 nm passes through the display 320 is close to 0% and the maximum transmittance in the wavelength region of 400 nm to 800 nm is also less than 50%.

In an embodiment, comparing the first camera 310 and the second camera 330, the second camera 330 is an under-display camera that is disposed under the display 320 to acquire an image of light passing through the display 320, and the first camera 310 is a general camera that acquires an image of light passing through the window glass and a lens assembly (e.g., the lens assembly 210 of FIG. 2) without passing through the display 320. That is, the first camera 310 may acquire an image of incident light to correspond to the first graph 402, and the second camera 330 may acquire an image of incident light to correspond to the second graph 404.

According to an embodiment, the light incident to the second camera 330 may be incident light having a large transmittance difference for each wavelength. Since the light incident on the second camera 330 has a large difference in transmittance for each wavelength, an image photographed by the second camera 330 may be different from a scene actually photographed. For example, the second camera 330 may acquire an image having a color different from that of an actual scene. As another example, when the second camera 330 and the first camera 310 capture the same scene to acquire an image, an image photographed by the first camera 310 and an image photographed by the second camera 330 may have different brightness or colors. Accordingly, the processor 340 may correct the image data acquired through the second camera 330 to reduce a difference between the actual scene and the image photographed by the second camera 330. For example, the processor 340 may apply a correction value stored in the first memory 360 to the image data acquired through the second camera 330. An operation in which the processor 340 corrects the image data may be referred to as calibration.

Even if the light incident on the second camera 330 decreases in its transmittance while passing through the display 320 or the light has a different transmittance for each wavelength, the electronic device 101 according to the disclosure may acquire an image with improved quality by correcting the image acquired through the second camera 330. In addition, the electronic device 101 may update a correction value for correcting the image through feedback using the image acquired through the second camera 330. Hereinafter, operations in which the processor 340 corrects a correction value related to the second camera 330 will be described.

Figure 5A:
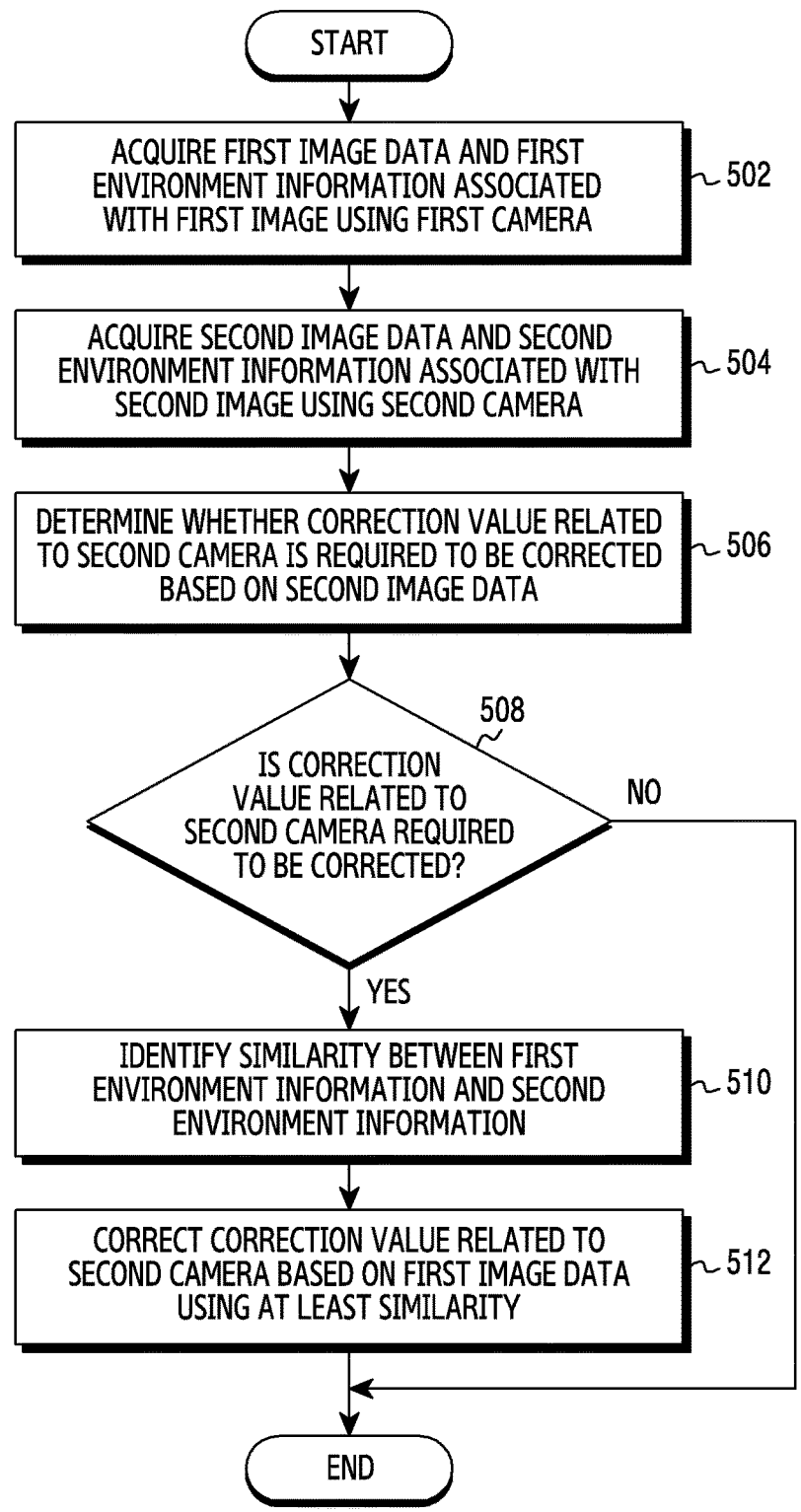
FIG. 5A is a flowchart illustrating an operation in which an electronic device corrects a correction value related to a second camera according to an embodiment of the disclosure.

FIG. 5A is a flowchart illustrating an operation in which the electronic device 101 corrects a correction value related to the second camera 330 according to an embodiment of the disclosure. Operations of FIG. 5A may be performed by the processor 340 of FIG. 3.

According to an embodiment, in operation 502, the processor 340 may acquire first image data and first environment information related to the first image data using the first camera 310. According to an embodiment, the processor 340 may further acquire the first environment information using the sensor 350. According to an embodiment, the first environment information may include at least one of illuminance, a color temperature, an amount of infrared light, or location information on the location of the electronic device 101 when the first image data is acquired. According to an embodiment, the processor 340 may acquire the location and/or angle of the electronic device 101 through a motion sensor (e.g., a gyro sensor or an angle sensor). The first environment information may include location and/or angle information of the electronic device 101 when the first image data is acquired.

According to an embodiment, in operation 504, the processor 340 may acquire second image data and second environment information related to the second image data using the second camera 330. According to an embodiment, the processor 340 may further acquire the second environment information by using the sensor 350. According to an embodiment, the second environment information may include at least one of illuminance, a color temperature, an amount of infrared light, or location information on the location of the electronic device 101 when the second image data is acquired. According to an embodiment, the processor 340 may acquire location and/or angle of the electronic device 101 through a motion sensor (e.g., a gyro sensor or an angle sensor). The second environment information may include the location and/or angle information of the electronic device 101 when the second image data is acquired.

According to an embodiment, in operation 506, the processor 340 may determine whether a correction value related to the second camera 330 is required to be corrected based on the second image data. For example, the processor 340 may determine that the correction value is required to be corrected based on a result of comparing color information of the first image data and color information of the second image data. For another example, when the processor 340 determines that a shading profile of the second image data does not satisfy a designated condition or is different from a shading profile of the first image data, the processor 340 may determine the correction value to be required to be corrected.

According to an embodiment, in operation 508, when it is determined that the correction value related to the second camera 330 is required to be corrected, the processor 340 may perform operation 510. When it is determined that the correction value related to the second camera 330 is not required to be corrected, the processor 340 may terminate the corresponding process without performing operations 510 to 512.

According to an embodiment, in operation 510, the processor 340 may identify a similarity between the first environment information and the second environment information. For example, the processor 340 may determine the similarity by comparing the color temperature information included in the first environment information with the color temperature information included in the second environment information. As another example, the processor 340 may determine the similarity by comparing the amount of infrared light included in the first environment information with the amount of infrared light included in the second environment information. As another example, the processor 340 may determine the similarity by combining various pieces of information included in the first environment information and the second environment information.

According to an embodiment, in operation 512, the processor 340 may correct the correction value related to the second camera 330 based on the first image data using at least the similarity. For example, the processor 340 may store information on the similarity between the first environment information and the second environment information while correcting the correction value so that the second image data is similar to the first image data. When acquiring third environment information (e.g., environment information related to the third image data) having a greater similarity to the second environment information than the first environment information, the processor 340 may store information on the similarity between the second environment information and the third environment information while correcting the correction value so that the second image data is similar to the third image data.

Figure 5B:
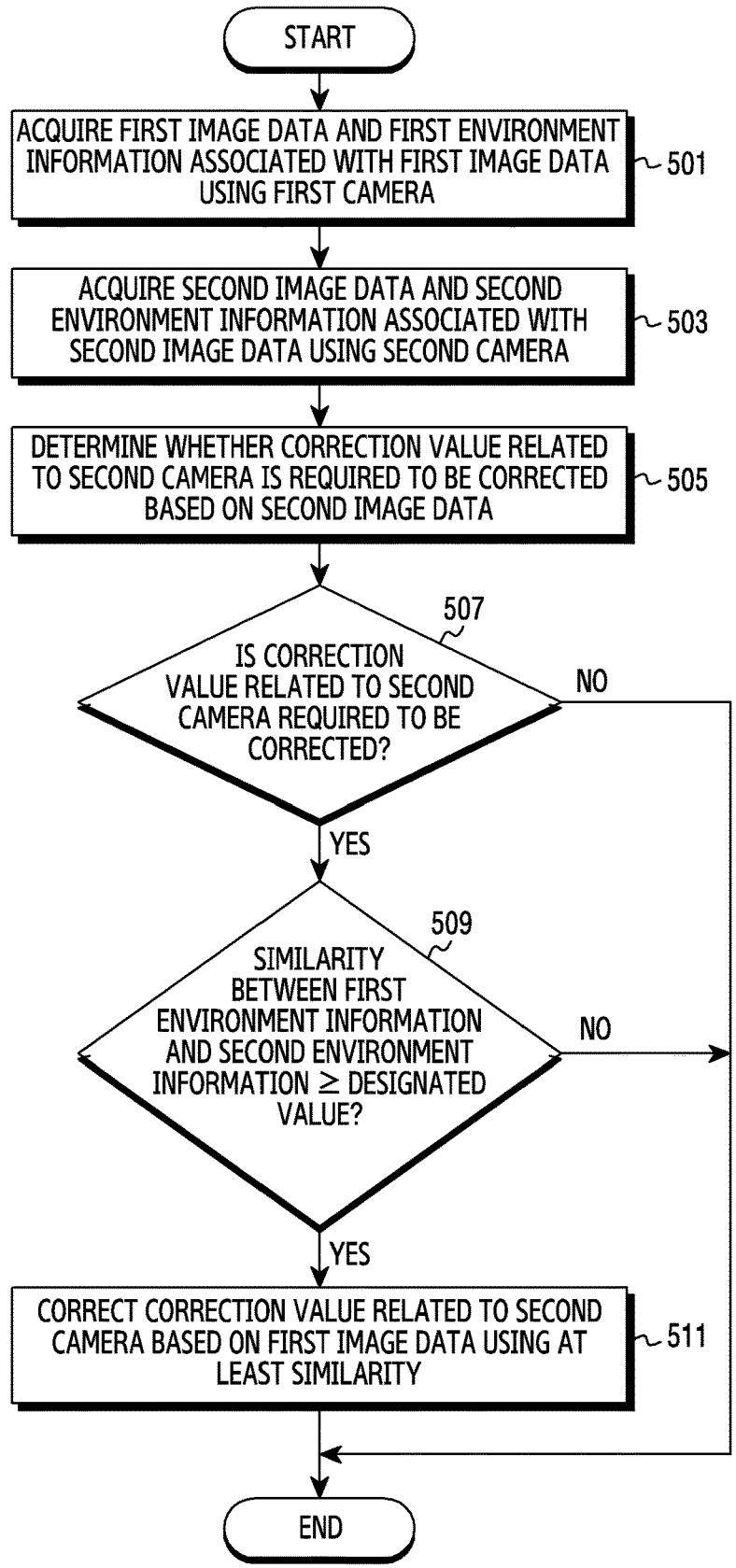
FIG. 5B is a flowchart illustrating an operation in which an electronic device corrects a correction value related to a second camera according to an embodiment of the disclosure.

FIG. 5B is a flowchart illustrating an operation in which the electronic device 101 corrects a correction value related to the second camera 330 according to an embodiment of the disclosure.

Operations of FIG. 5B may be performed by the processor 340 of FIG. 3.

According to an embodiment, in operation 501, the processor 340 may acquire first image data and first environment information related to the first image data using the first camera 310. According to an embodiment, the processor 340 may further acquire the first environment information using the sensor 350. According to an embodiment, the first environment information may include at least one of illuminance, a color temperature, an amount of infrared light, or location information on the location of the electronic device 101 when the first image data is acquired.

According to an embodiment, in operation 503, the processor 340 may acquire second image data and second environment information related to the second image data using the second camera 330. According to an embodiment, the processor 340 may further acquire the second environment information using the sensor 350. According to an embodiment, the second environment information may include at least one of illuminance, a color temperature, an amount of infrared light, or location information on the location of the electronic device 101 when the second image data is acquired.

According to an embodiment, in operation 505, the processor 340 may determine whether a correction value related to the second camera 330 is required to be corrected based on the second image data. For example, the processor 340 may determine that the correction value is required to be corrected based on a result of comparing color information of the first image data and color information of the second image data. For another example, when it is determined that a shading profile of the second image data does not satisfy a designated condition or is different from a shading profile of the first image data, the processor 340 may determine the correction value to be required to be corrected.

According to an embodiment, the correction value related to the second camera 330 may include at least one of a white balance correction value for correcting a white balance of the second camera 330 or a lens shading correction value for correcting lens shading of the second camera 330. For example, the processor 340 may apply the white balance correction value to image data acquired from the second camera 330 to adjust the color temperature and sense of coloring of the image data. As another example, the processor 340 may apply the lens shading correction value to the image data acquired from the second camera 330 to correct lens shading caused by the lens assembly included in the second camera 330. According to an embodiment, the white balance correction value and/or the lens shading correction value may be understood to include a plurality of correction values corresponding to different environments around the electronic device 101.

According to an embodiment, in operation 507, when it is determined that the correction value related to the second camera 330 is required to be corrected, the processor 340 may perform operation 509. When it is determined that the correction value related to the second camera 330 is not required to be corrected, the processor 340 may terminate the corresponding process without performing operations 509 to 511.

According to an embodiment, in operation 509, in response to determining that the correction value related to the second camera 330 is required to be corrected, the processor 340 may determine whether a similarity between the first environment information and the second environment information is equal to or greater than a designated value. For example, the similarity may refer to the similarity identified in operation 510 of FIG. 5A.

According to an embodiment, in operation 509, when it is determined that the similarity is equal to or greater than the designated value, the processor 340 may perform operation 511. According to another embodiment, in operation 509, when it is determined that the similarity is less than the designated value, the processor 340 may terminate the corresponding process without performing operation 511. For example, when the similarity between the first environment information and the second environment information is less than the designated value, the processor 340 may terminate the corresponding process without performing operation 511 because it is not appropriate for the processor 340 to use the first image data as a reference to correct the correction value related to the second camera 330.

According to an embodiment, in operation 511, in response to determining that the similarity is equal to or greater than the designated value, the processor 340 may determine the correction value related to the second camera 330 based on the first image data by using at least the similarity. For example, the processor 340 may store information on the similarity between the first environment information and the second environment information while correcting the correction value so that the second image data is similar to the first image data. When acquiring third environment information (e.g., environment information related to the third image data) having a greater similarity to the second environment information than the first environment information, the processor 340 may store information on the similarity between the second environment information and the third environment information together while correcting the correction value so that the second image data is similar to the third image data.

According to an embodiment, the processor 340 may correct the correction value related to the second camera 330 based on the first image data. The first image data may be image data acquired by the processor 340 performing calibration through the first camera 310. The processor 340 may correct the correction value so that two images photographed through the first camera 310 and the second camera 330 in the same (or similar) environment have similar characteristics by a predetermined level or more. For example, while photographing an image using the first camera 310 and the second camera 330 in the same environment, the processor 340 may acquire an image of light having a different transmittance for each wavelength while passing through the display 320, and when there is a difference in the color information between the first image data and the second image data, the processor 340 may apply the white balance correction value to the second image data to reduce the difference between the color information of the first image data and the color information of the second image data. When there is the difference in the color information between the first image data and the second image data even after the white balance correction value stored in advance is applied to the second image data, the processor 340 may correct the white balance correction value so that the difference between the color information of the first image data and the color information of the second image data to which the correction value is applied is reduced.

Figure 6:
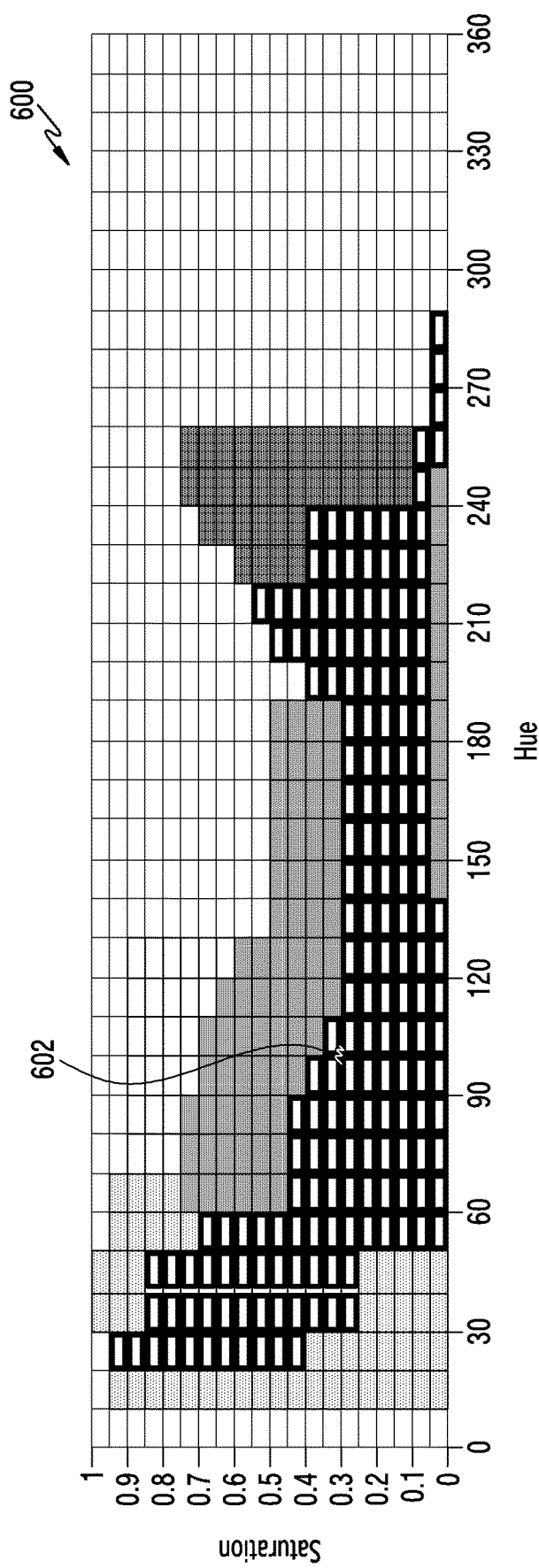
FIG. 6 is a diagram illustrating an example of a method of acquiring color information of first image data and second image data in an electronic device according to an embodiment of the disclosure.

FIG. 6 is a diagram illustrating an example of a method of acquiring color information of first image data and second image data in the electronic device 101 according to an embodiment of the disclosure.

Referring to FIG. 6, a graph 600 indicates a hue saturation (HS) map which is one example of a method in which the electronic device 101 may acquire color information of image data acquired through a camera module (e.g., the first camera 310 or the second camera 330). The horizontal axis of the graph 600 is hue and the vertical axis thereof is saturation.

According to an embodiment, the processor 340 may acquire raw image data through the camera module (e.g., the first camera 310 or the second camera 330), may perform color conversion from an RGB domain to an hue, saturation, value (HSV) domain, and may identify an area corresponding to the hue and saturation of the color-converted image data in the HS map (e.g., the graph 600 of FIG. 6). According to an embodiment, the processor 340 may identify a corresponding area on the HS map by using the central area of the image in order to reduce the effect of lens shading.

According to an embodiment, the processor 340 may acquire first image data from the first camera 310, may convert the first image data into an HSV domain, and may identify an area 602 corresponding to the hue and saturation of the color-converted first image data in the HS map. In addition, the processor 340 may acquire second image data from the second camera 330, may apply a correction value (e.g., a white balance correction value related to the second camera 330 and a lens shading correction value related to the second camera 330) stored in the first memory 360 to the second image data, may convert the second image data to which the correction value is applied into an HSV domain, and may identify an area corresponding to the hue and saturation of the color-converted second image in the HS map.

According to an embodiment, the processor 340 may compare areas corresponding to the first image data and the second image data on the HS map (e.g., the graph 600) to perform operation 506 of FIG. 5A or operation 505 of FIG. 5B. For example, the processor 340 may compare the area 602 corresponding to the first image data with the area corresponding to the second image data (e.g., the second image data to which the correction value is applied) on the HS map to determine whether the correction value related to the second camera 330 is required to be corrected.

According to an embodiment, the processor 340 may compare the areas corresponding to the first image data and the second image data on the HS map (e.g., the graph 600) to perform operation 512 of FIG. 5A or operation 511 of FIG. 5B. For example, the processor 340 may correct the correction value applied to the second image data so that the area corresponding to the second image data and the area 602 corresponding to the first image data coincide with each other on the HS map.

According to an embodiment, although a method of acquiring color information of image data using the HS map has been described in FIG. 6, this is an example, and various embodiments that can be implemented by a person skilled in the art are possible.

Figure 7:
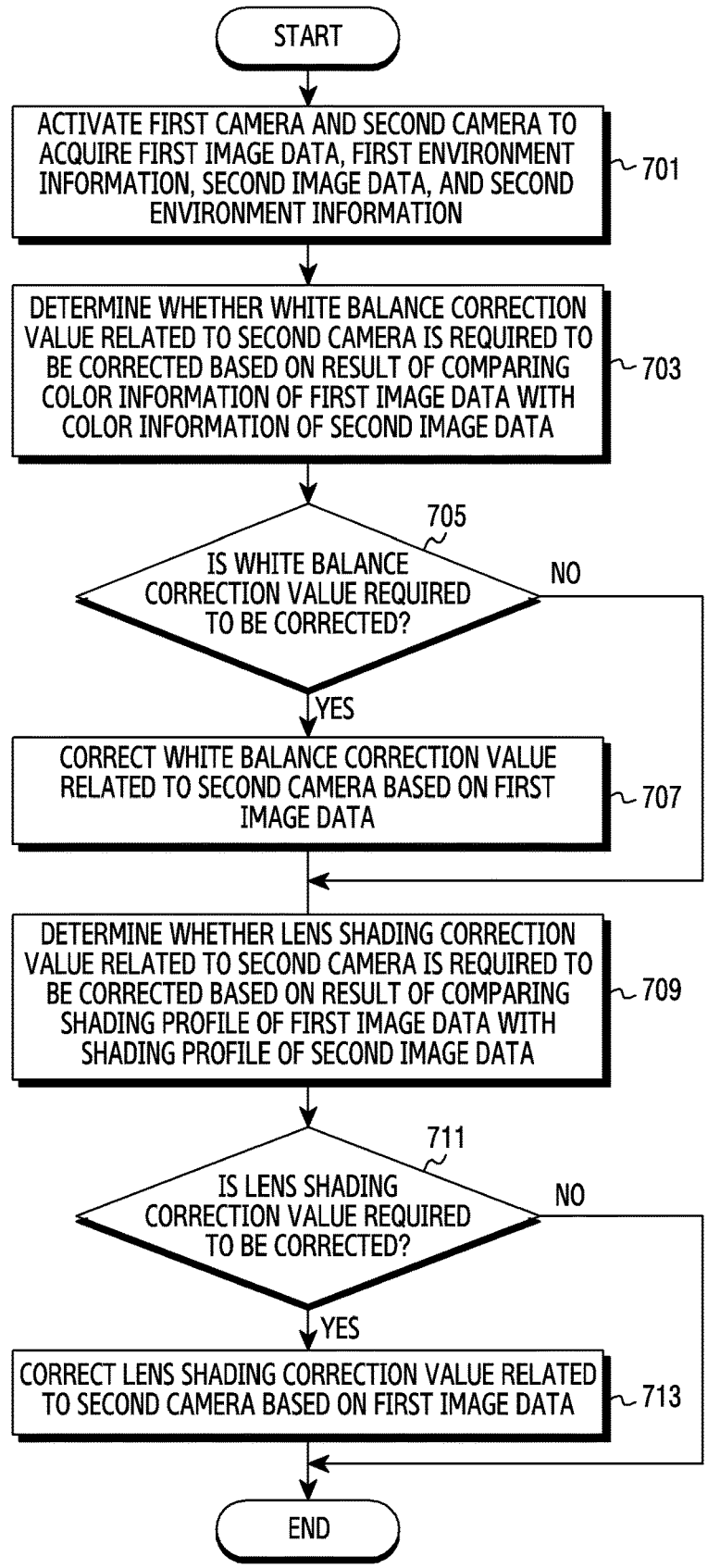
FIG. 7 is a flowchart illustrating an operation in which an electronic device corrects a correction value related to a second camera when a first camera and the second camera are arranged in the electronic device to face the same direction according to an embodiment of the disclosure.

FIG. 7 is a flowchart illustrating an operation in which the electronic device 101 corrects a correction value related to the second camera 330 when the first camera 310 and the second camera 330 are arranged in the electronic device 101 to face the same direction according to an embodiment of the disclosure. Operations of FIG. 7 may be performed by the processor 340 of FIG. 3.

According to an embodiment, the electronic device 101 may include the first camera 310 and the second camera 330 facing the same direction. For example, the first camera 310 and the second camera 330 may be arranged on the rear surface of the front side of the electronic device 101 (e.g., a bar-type electronic device) to face the front surface. The front side of the electronic device 101 may refer to a direction in which the display 320 faces. As another example, the electronic device 101 is a foldable electronic device including a flexible display, and the first camera 310 and the second camera 330 may be arranged to face the same direction in a state in which the foldable electronic device is unfolded. In FIG. 7, when the first camera 310 and the second camera 330 are arranged in the electronic device 101 to face the same direction, the processor 340 may correct a correction value related to the second camera 330.

According to an embodiment, in operation 701, the processor 340 may activate the first camera 310 and the second camera 330 to acquire first image data, first environment information, second image data, and second environment information. According to an embodiment, the processor 340 may activate both the first camera 310 and the second camera 330 facing the same direction. The processor 340 may acquire first image data and second image data photographed within a designated time interval. For example, the processor 340 may control the first camera 310 and the second camera 330 to photograph the first image data and the second image data, respectively, at the same time point.

According to an embodiment, in operation 703, the processor 340 may determine whether a white balance correction value related to the second camera 330 is required to be corrected based on a result of comparing color information of the first image data with color information of the second image data.

According to an embodiment, in operation 705, when it is determined that the white balance correction value is required to be corrected, the processor 340 may perform operation 707. For example, when there is a difference between the area 602 corresponding to the first image data and the area corresponding to the second image data (e.g., the second image data to which the correction value is applied) on the HS map (e.g., the graph 600 of FIG. 6) by a predetermined level or more, the processor 340 may determine that it is necessary to correct the white balance correction value related to the second camera 330. According to another embodiment, in operation 705, when it is determined that it is not necessary to correct the white balance correction value, the processor 340 may perform operation 709 without performing operation 707.

According to an embodiment, in operation 707, in response to determining that it is necessary to correct the white balance correction value, the processor 340 may correct the white balance correction value related to the second camera 330 based on the first image data. The processor 340 may correct the white balance correction value related to the second camera 330 so that a difference between the color information of the first image data and the color information of the second image data is reduced. For example, when it is determined that the distribution of the area 602 corresponding to the first image data and the area corresponding to the second image data does not match on the HS map, the processor 340 may correct the white balance correction value. The processor 340 may identify the area corresponding to the second image data to which the corrected white balance correction value is applied on the HS map, and may compare the identified area with the area 602 corresponding to the first image data on the HS map. The processor 340 may repeat an operation of correcting the white balance correction value related to the second camera 330 until it is determined that the distribution of the area corresponding to the second image data to which the corrected white balance correction value is applied on the HS map matches the distribution of the area 602 corresponding to the first image data by a predetermined level or more. That is, the processor 340 may correct the white balance correction value based on the area 602 corresponding to the first image data on the HS map.

According to an embodiment, in operation 709, the processor 340 may determine that it is necessary to correct a lens shading correction value related to the second camera 330 based on a result of comparing a shading profile of the first image data with a shading profile of the second image data. For example, when the brightness of the edge area of the first image data is lower than that of the center area of the first image data (or the second image data), or when the colors of the center area and the edge area are different from each other, the processor 340 may determine that it is necessary to correct the lens shading correction value.

According to an embodiment, in operation 711, when it is determined that it is necessary to correct the lens shading correction value, the processor 340 may perform operation 713. For example, when it is determined that the shading profile of the first image data and the shading profile of the second image data are different from each other, the processor 340 may determine that it is not necessary to correct the lens shading correction value. For another example, when it is determined that the shading profile of the second image data does not satisfy a designated condition (e.g., the second image data has an abnormal shading profile), the processor 340 may determine that it is necessary to correct the lens shading correction value. According to another embodiment, when it is determined that it is not necessary to correct the lens shading correction value, the processor 340 may terminate the corresponding process without performing operation 713.

According to an embodiment, in operation 713, in response to determining that it is necessary to correct the lens shading correction value, the processor 340 may correct the lens shading correction value related to the second camera 330 based on the first image data. The processor 340 may correct the lens shading correction value related to the second camera 330 so that a difference between the shading profile of the first image data and the shading profile of the second image data is reduced. For example, the processor 340 may identify an area satisfying a designated condition in the first image data and the second image data. The area satisfying the designated condition may refer to an area corresponding to a subject through which it is easy to identify lens shading such as a ceiling or a monochromatic wallpaper. The processor 340 may correct the lens shading correction value so that the shading profile of the identified area in the second image data matches the shading profile of the identified area in the first image data by a predetermined level or more. That is, the processor 340 may correct the lens shading correction value based on the shading profile of the first image data.

According to an embodiment, in FIG. 7, after correcting the white balance correction value related to the second camera 330 in operations 703 to 707, the lens shading correction value related to the second camera 330 may be corrected in operations 709 to 713, but this is an example, and various embodiments that can be implemented by those skilled in the art are possible. For example, the white balance correction value and the lens shading correction value may be corrected in parallel with each other, or the white balance correction value may be corrected after the lens shading correction value is corrected.

Referring to FIGS. 5B and 7, when the first camera 310 and the second camera 330 are arranged in the electronic device 101 to face the same direction, a similarity between the first environment information and the second environment information may be determined to be equal to or greater than the designated value. When the first camera 310 and the second camera 330 face the same direction, the processor 340 may activate the first camera 310 and the second camera 330 together to acquire the first image data and the second image data, so that the processor 340 may determine that the similarity is equal to or greater than the designated value or may omit operation 509 of FIG. 5B.

Figure 8A:
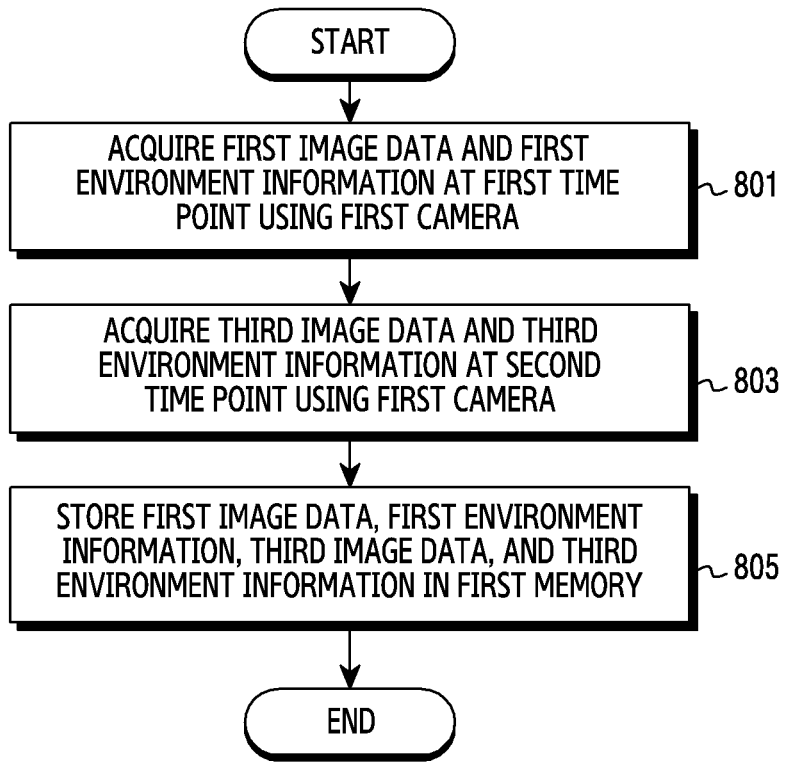
FIG. 8A is a flowchart illustrating an operation in which an electronic device stores information acquired through a first camera when the first camera and a second camera are arranged in the electronic device to face different directions according to an embodiment of the disclosure.

FIG. 8A is a flowchart illustrating an operation in which the electronic device 101 stores information acquired through the first camera 310 when the first camera 310 and the second camera 330 are arranged in the electronic device 101 to face different directions according to an embodiment of the disclosure. Operations of FIG. 8A may be performed by the processor 340 of FIG. 3.

Figure 8B:
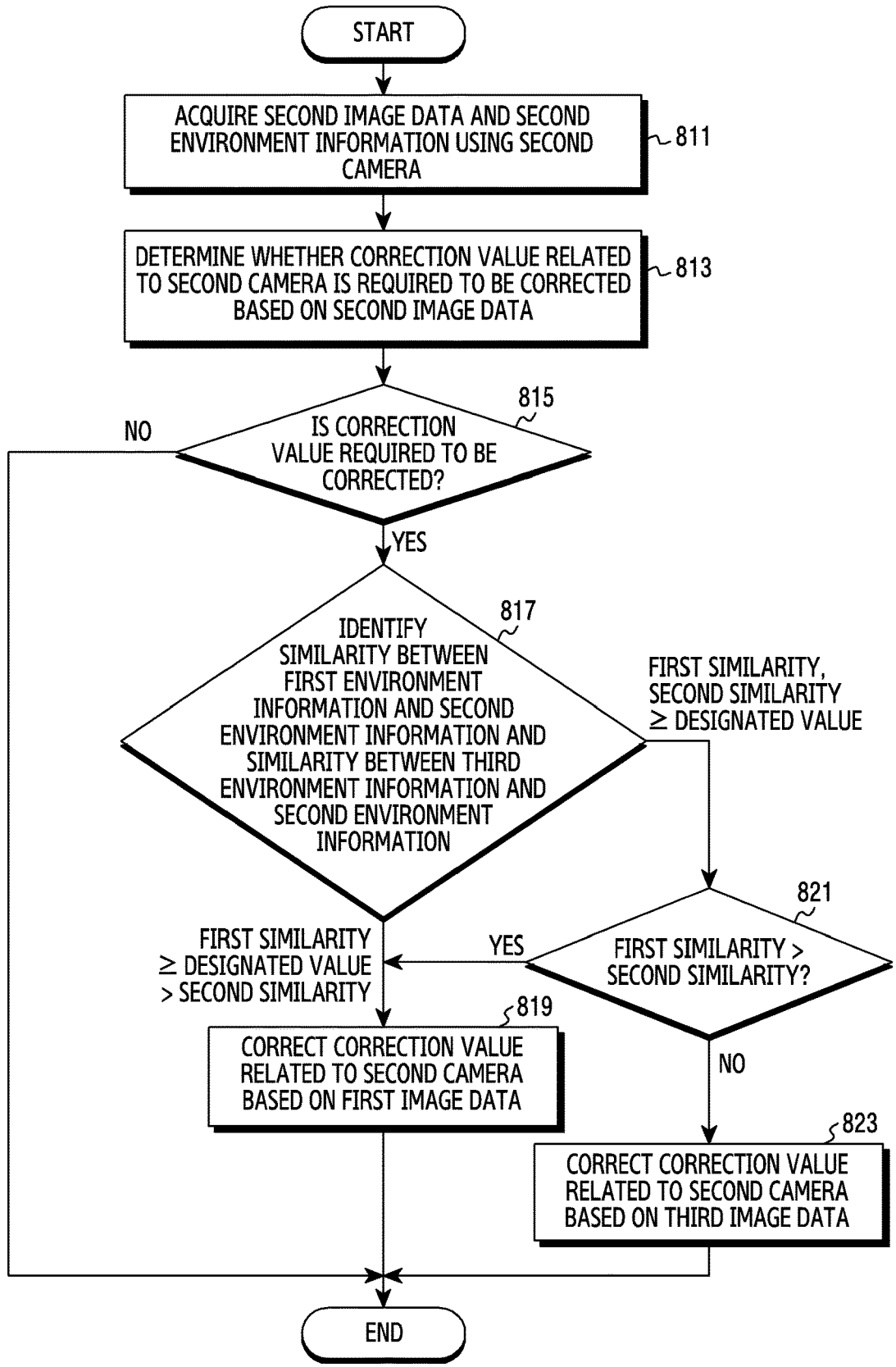
FIG. 8B is a flowchart illustrating an operation in which an electronic device corrects a correction value related to a second camera when a first camera and the second camera are arranged in the electronic device to face different directions according to an embodiment of the disclosure.

According to an embodiment, the electronic device 101 may include the first camera 310 and the second camera 330 facing different directions. For example, the first camera 310 may be disposed to face the rear surface on the back side of the rear surface of the electronic device 101, and the second camera 330 may be disposed to face the front surface on the rear surface of the front side of the electronic device 101. The front side of the electronic device 101 may refer to a direction in which the display 320 faces. In FIGS. 8A and 8B, when the first camera 310 and the second camera 330 are arranged in the electronic device 101 to face different directions (e.g., opposite directions), the processor 340 may correct the correction value related to the second camera 330.

According to an embodiment, in operation 801, the processor 340 may acquire first image data and first environment information related to the first image data at a first time point by using the first camera 310. In an embodiment, operation 801 may correspond to operation 502 of FIG. 5A or operation 501 of FIG. 5B.

According to an embodiment, in operation 803, the processor 340 may acquire third image data and third environment information related to the third image data at a second time point different from the first time point by using the first camera 310. According to an embodiment, the processor 340 may further acquire third environment information by using the sensor 350. The third environment information may include at least one of illuminance, a color temperature, an amount of infrared light, or location information on the location of the electronic device 101 when the third image data is acquired.

According to an embodiment, in operation 805, the processor 340 may store the first image data, the first environment information, the third image data, and the third environment information in the first memory 360.

According to an embodiment, the processor 340 may acquire image data through the first camera 310 while executing an application supporting the first camera 310, and may determine whether the image data satisfies a designated condition. For example, the designated condition may refer to whether the image data can be used when the correction value related to the second camera 330 is corrected. The processor 340 may store, in the first memory 360, first image data and third image data which are determined to be the image data that can be used when the correction value related to the second camera 330 is corrected. For example, when it is determined that the first image data acquired through the first camera 310 can be used when a white balance correction value related to the second camera 330 is corrected, the processor 340 may store the first image data and the first environment information in the first memory 360. For another example, when it is determined that at least a partial area of the third image data acquired through the first camera 310 can be used when a lens shading correction value related to the second camera 330 is corrected, the processor 340 may store the at least a partial area of the third image data and the third environment information in the first memory 360.

FIG. 8B is a flowchart illustrating an operation in which the electronic device 101 corrects a correction value related to the second camera 330 when the first camera 310 and the second camera 330 are arranged in the electronic device 101 to face different directions according to an embodiment of the disclosure. Operations of FIG. 8B may be performed by the processor 340 of FIG. 3. In FIG. 8B, when the first camera 310 and the second camera 330 are arranged in the electronic device 101 to face different directions (e.g., opposite directions), the processor 340 may correct the correction value related to the second camera 330.

According to an embodiment, in operation 811, the processor 340 may acquire second image data and second environment information related to the second image data using the second camera 330. In an embodiment, operation 811 may correspond to operation 504 of FIG. 5A or operation 503 of FIG. 5B.

According to an embodiment, in operation 813, the processor 340 may determine whether it is necessary to correct the correction value related to the second camera 330 based on the second image data.

According to an embodiment, the processor 340 may determine whether it is necessary to correct the white balance correction value related to the second camera 330 based on color information of the second image data. For example, when the color information of the second image data does not correspond to information (e.g., illuminance or color temperature) acquired through the sensor 350, or when the color information of the second image data is different from previously stored information (e.g., information on a color when a subject is the sky or information on a color of a person's skin), the processor 340 may determine that it is necessary to correct the white balance correction value related to the second camera 330.

According to an embodiment, the processor 340 may determine whether it is necessary to correct the lens shading correction value related to the second camera 330 based on the shading profile of the second image data. For example, when it is determined that the shading profile of the second image data does not satisfy a designated condition (e.g., when the second image data has an abnormal shading profile), the processor 340 may determine that it is necessary to correct the lens shading correction value related to the second camera 330.

According to an embodiment, in operation 815, when it is determined that it is necessary to correct the correction value related to the second camera 330, the processor 340 may perform operation 817. For example, when it is determined that it is necessary to correct at least one of the white balance correction value or lens shading correction value related to the second camera 330, the processor 340 may perform operation 817. According to another embodiment, when it is determined that it is not necessary to correct the correction value related to the second camera 330, the processor 340 may terminate the corresponding process without performing operations 817 to 823.

According to an embodiment, in operation 817, the processor 340 may identify a first similarity between the first environment information and the second environment information, and may identify a second similarity between the third environment information and the second environment information. For example, in response to determining that it is necessary to correct the correction value related to the second camera 330, the processor 340 may identify the first similarity and the second similarity to select image data most similar to the second image data among the image data (e.g., the first image data and the third image data) stored in the first memory 360.

According to an embodiment, a magnitude relationship among the first similarity, the second similarity, and the designated value of FIG. 5B may be provided in various ways. For example, various magnitude relationships such as "designated value>first similarity>second similarity", "first similarity>specified value>second similarity", or "first similarity>second similarity>specified value" may be provided. However, for convenience of description, in FIG. 8B, there are cases in which the first similarity is equal to or greater than the designated value and the second similarity is less than the designated value (operation 819), and both the first and second similarities are equal to or greater than the designated value (operation 821).

According to an embodiment, in operation 819, in response to determining that the first similarity is equal to or greater than the designated value and the second similarity is less than the designated value, the processor 340 may correct the correction value related to the second camera 330 based on the first image data. For example, when the first similarity is equal to or greater than the designated value and the second similarity is less than the designated value, it may be appropriate for the processor 340 to use the first image data as a reference to correct the correction value related to the second camera 330, but it may not be appropriate to use the third image data as a reference. Accordingly, the processor 340 may correct the correction value (e.g., the white balance correction value and the lens shading correction value) related to the second camera 330 based on the first image data.

According to an embodiment, in operation 821, in response to determining that the first similarity and the second similarity are equal to or greater than the designated value, the processor 340 may identify a greater similarity among the first and second similarities. The processor 340 may perform operation 819 when the first similarity is greater than the second similarity, and may perform operation 823 when the first similarity is less than the second similarity.

According to an embodiment, in response to determining that the first similarity and the second similarity are equal to or greater than the designated value and the first similarity is greater than the second similarity, the processor 340 may correct the correction value related to the second camera 330 based on the first image data. When both the first similarity and the second similarity are equal to or greater than the designated value, the processor 340 may correct the correction value related to the second camera 330 based on the first image data, or may correct the correction value based on the third image data. However, in a case in which the first similarity is greater than the second similarity, when the processor 340 corrects the correction value related to the second camera 330, using the first image data as a reference may improve the quality of the correction compared to using the third image data as a reference. Accordingly, the processor 340 may correct the correction value (e.g., the white balance correction value and the lens shading correction value) related to the second camera 330 based on the first image data.

According to an embodiment, in operation 823, in response to determining that both the first similarity and the second similarity are equal to or greater than the designated value and the first similarity is not greater than the second similarity, the processor 340 may correct the correction value related to the second camera 330 based on the third image data. In a case in which the second similarity is greater than the first similarity, when the processor 340 corrects the correction value related to the second camera 330, using the third image data as a reference may improve the quality of the correction compared to using the first image data as a reference. Accordingly, the processor 340 may correct the correction value (e.g., the white balance correction value and the lens shading correction value) related to the second camera 330 based on the third image data.

According to an embodiment, when the first similarity and the second similarity are the same, the processor 340 may correct the correction value related to the second camera 330 based on at least one of the first image data or the third image data.

According to an embodiment, the processor 340 may correct the correction value related to the second camera 330 based on at least one of the first image data or the third image data, and may store meta data together with the corrected correction value. For example, the processor 340 may correct the correction value related to the second camera 330 based on the first image data, and may store at least one of the first image data or the first environment information together as the meta data for the corrected correction value.

According to an embodiment, when it is determined that the correction value is required to be further corrected after the correction of the correction value related to the second camera 330 in operation 819 or 823, the processor 340 may correct the correction value related to the second camera 330 based on the meta data. For example, the processor 340 may generate a second correction value by correcting a first correction value related to the second camera 330 based on the first image data, may store the second correction value together with the meta data for the first image data and the first environment information, may acquire fourth image data and fourth environment information by using the second camera 330 after a predetermined time elapses, and may determine whether it is necessary to correct the second correction value related to the second camera 330 by using the fourth image data and the stored meta data together.

Figure 9:
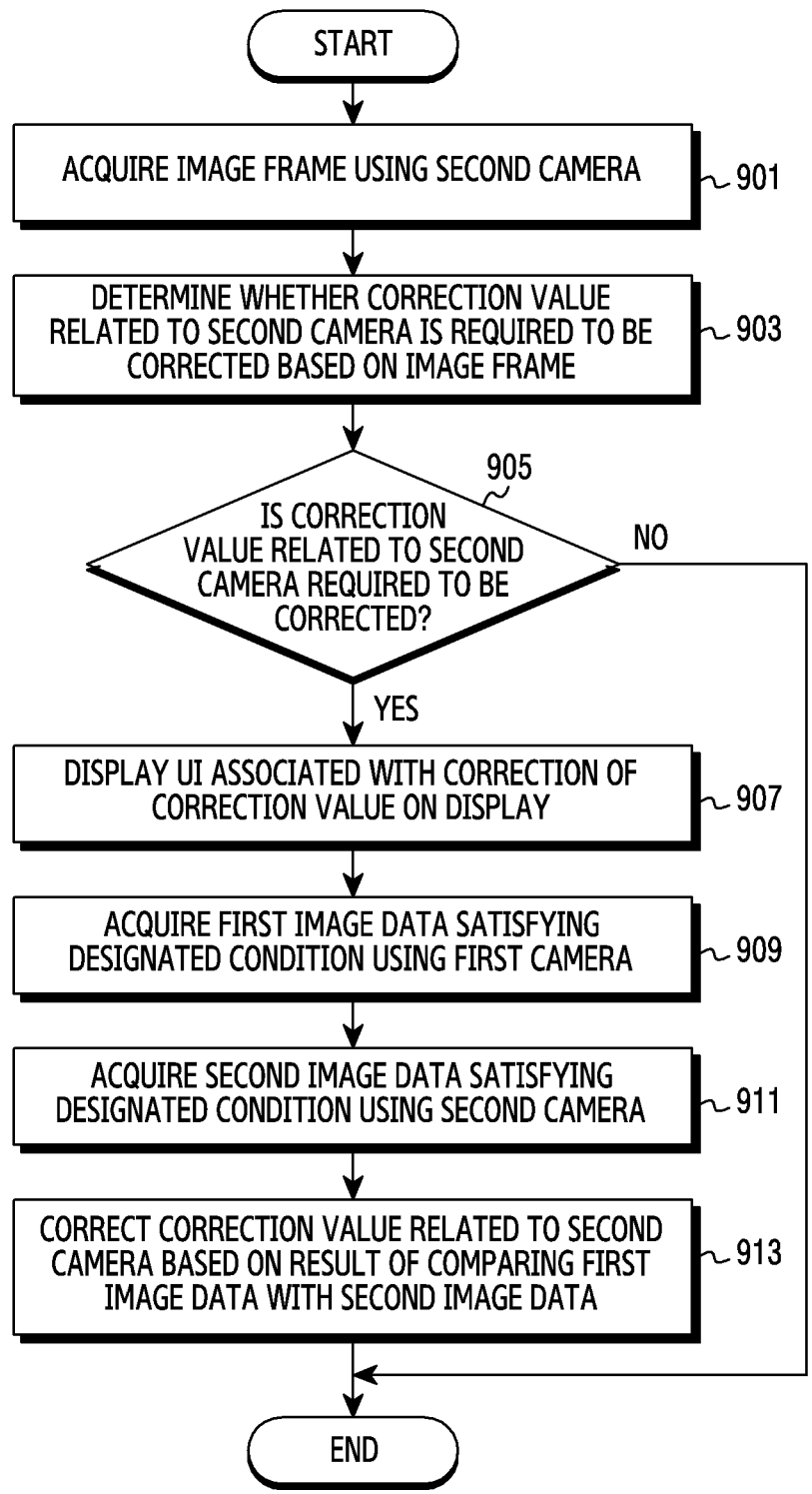
FIG. 9 is a flowchart illustrating an operation of displaying a user interface (UI) before an electronic device corrects a correction value related to a second camera according to an embodiment of the disclosure.

FIG. 9 is a flowchart illustrating an operation of displaying a user interface (UI) before the electronic device 101 corrects a correction value related to the second camera 330 according to an embodiment of the disclosure. Operations of FIG. 9 may be performed by the processor 340 of FIG. 3.

According to an embodiment, in operation 901, the processor 340 may acquire an image frame using the second camera 330. For example, the processor 340 may acquire image frames using the second camera 330, and may display at least some of the image frames as a preview on the display 320.

According to an embodiment, in operation 903, the processor 340 may determine whether it is necessary to correct a correction value related to the second camera 330 based on the image frame. For example, the processor 340 may determine whether it is necessary to correct a white balance correction value related to the second camera 330 based on color information of the image frame acquired through the second camera 330. As another example, the processor 340 may determine whether it is necessary to correct a lens shading correction value related to the second camera 330 based on a shading profile of the image frame acquired through the second camera 330.

According to another embodiment, the processor 340 may determine whether it is necessary to correct the correction value related to the second camera 330 based on whether a user input is received. For example, the processor 340 may display the image frame acquired through the second camera 330 on the display 320 and may receive a user input associated with the correction of the correction value of the second camera 330. The processor 340 may determine that it is necessary to correct the correction value related to the second camera 330 in response to receiving the user input.

According to an embodiment, in operation 905, when it is determined that it is necessary to correct the correction value related to the second camera 330, the processor 340 may perform operation 907. For example, when it is determined that it is necessary to correct the correction value based on the image frame acquired from the second camera 330, the processor 340 may perform operation 907. For another example, when the user input associated with the correction of the correction value is received, the processor 340 may perform operation 907. According to another embodiment, in response to determining that it is not necessary to correct the correction value related to the second camera 330, the processor 340 may terminate the corresponding process without performing operations 907 to 913.

According to an embodiment, in operation 907, in response to determining that it is necessary to correct the correction value related to the second camera 330, the processor 340 may display, on the display 320, a user interface (UI) associated with the correction of the correction value. For example, the processor 340 may output a UI including a message indicating that it is necessary to correct the correction value related to the second camera 330. The processor 340 may display, on the display 320, a button for starting the operation of correcting the correction value together with the message indicating that it is necessary to correct the correction value related to the second camera 330. The processor 340 may perform operation 909 after a predetermined time elapses after outputting the UI associated with the correction of the correction value. The processor 340 may perform operation 909 in response to receiving a user input for the button (e.g., a touch input for the button).

According to an embodiment, the UI may include a guidance for guiding a user's behavior in relation to the correction of the correction value. For example, since the processor 340 needs first image data photographed similarly to the second image data in order to correct the correction value for the second camera 330, the processor 340 may output the UI including the guidance.

According to an embodiment, in response to determining that it is necessary to correct the correction value related to the second camera 330, the processor 340 may output the UI associated with the correction of the correction value through at least one of a speaker (e.g., the audio module 170) or the haptic module 179. For example, the processor 340 may output audio data including a content that the correction value needs to be corrected through the speaker. That is, the processor 340 may transmit, to the user, the content that the correction value related to the second camera 330 needs to be corrected through various output methods.

According to an embodiment, in operation 909, the processor 340 may acquire first image data satisfying a designated condition by using the first camera 310. According to an embodiment, the processor 340 may acquire the first image data satisfying a first condition according to the guidance by using the first camera 310. In an embodiment, operation 909 may include operation 502 of FIG. 5A (or operation 501 of FIG. 5B). That is, operations 901 to 907 may be operations performed before operation 502 of FIG. 5A (or operation 501 of FIG. 5B) is performed.

According to an embodiment, in operation 911, the processor 340 may acquire second image data satisfying a designated condition by using the second camera 330. According to an embodiment, the processor 340 may acquire the second image data satisfying a second condition according to the guidance by using the second camera 330. In an embodiment, operation 911 may include operation 504 of FIG. 5A or operation 503 of FIG. 5B.

According to an embodiment, the processor 340 may induce a user's behavior through a UI (or a UI using various output modules) displayed on the display 320 in operation 907, and may acquire the first image data satisfying the designated condition (e.g., the first condition) and the second image data satisfying the designated condition (e.g., the second condition). According to an embodiment, the designated condition may be a condition related to a subject included in the first image data and the second image data. For example, the processor 340 may induce the user to photograph a subject satisfying a designated condition through the guidance. For example, the processor 340 may acquire first image data including a specific subject (e.g., wallpaper) using the first camera 310 and may acquire second image data including the specific subject using the second camera 330.

According to an embodiment, since the processor 340 acquires the first image data satisfying the designated condition and the second image data satisfying the designated condition, the operation of determining the similarity between the first environment information and the second environment information may be omitted. In addition, the processor 340 may not acquire the first environment information and the second environment information while acquiring the first image data and the second image data. The designated condition, the first condition, or the second condition may include a case in which the first environment information and the second environment information are similar to each other by a designated level or more.

According to an embodiment, in operation 913, the processor 340 may correct the correction value related to the second camera 330 based on a comparison result of the first image data and the second image data.

According to an embodiment, the processor 340 may correct the white balance correction value related to the second camera 330 based on a result of comparing the color information of the first image data with the color information of the second image data. For example, the processor 340 may correct the white balance correction value so that the color information of the second image data is similar to the color information of the first image data by a predetermined level or more. The color information of the first image data may include an HS map of the first image data, and the color information of the second image data may include an HS map of the second image data. The HS map of the first image data (or the second image data) may refer to an area corresponding to the hue and saturation of the first image data (or the second image data) in the HS map.

According to an embodiment, the processor 340 may correct the lens shading correction value related to the second camera 330 based on a result of comparing the shading profile of the first image data with the shading profile of the second image data. For example, the processor 340 may correct the lens shading correction value so that the shading profile of the second image data corresponds to the shading profile of the first image data.

According to an embodiment, when compared with the operations illustrated in FIG. 5B, when the operations illustrated in FIG. 9 are added, a difference is that the user's behavior (e.g., acquiring the first image data and second image data satisfying the designated condition) may be induced and the correction value related to the second camera 330 may be corrected in a state in which the user is aware.

Figure 10:
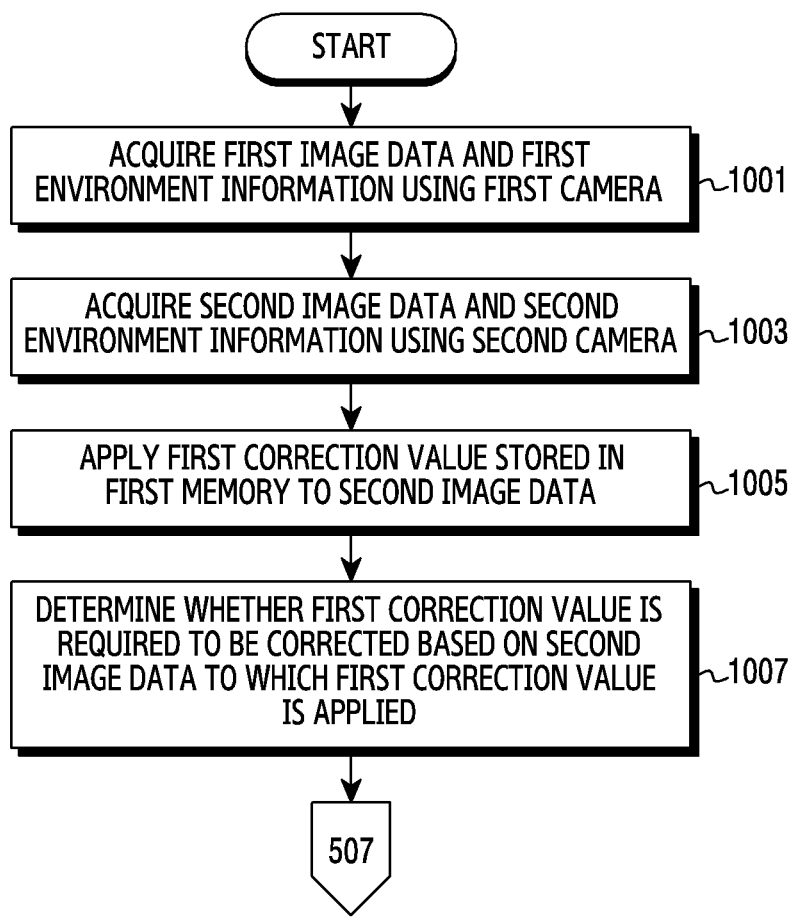
FIG. 10 is a flowchart illustrating an operation in which an electronic device applies a correction value stored in a first memory to second image data acquired through a second camera according to an embodiment of the disclosure.

FIG. 10 is a flowchart illustrating an operation in which the electronic device 101 applies a correction value stored in the first memory 360 to second image data acquired through the second camera 330 according to an embodiment of the disclosure. Operations of FIG. 10 may be performed by the processor 340 of FIG. 3.

According to an embodiment, in operation 1001, the processor 340 may acquire first image data and first environment information by using the first camera 310. In an embodiment, operation 1001 may correspond to operation 502 of FIG. 5A or operation 501 of FIG. 5B.

In an embodiment, in operation 1003, the processor 340 may acquire second image data and second environment information by using the second camera 330. In an embodiment, operation 1003 may correspond to operation 504 of FIG. 5A or operation 503 of FIG. 5B.

In an embodiment, in operation 1005, the processor 340 may apply a first correction value stored in the first memory 360 to the second image data. In an embodiment, the first correction value may correspond to a correction value related to the second camera 330. For example, the first correction value may refer to the correction value related to the second camera 330 which is stored in the first memory 360 at a specific time point. As another example, the first correction value may refer to a newly configured initial value when the correction value related to the second camera 330 is reset. The initial value will be described later with reference to FIG. 12A.

In an embodiment, in operation 1007, the processor 340 may determine whether it is necessary to correct the first correction value based on the second image data to which the first correction value is applied.

Although an operation corresponding to operation 1005 is not illustrated in FIGS. 5A and 5B, it may be understood that the processor 340 applies the correction value stored in the first memory 360 to all the image data acquired through the second camera 330.

According to an embodiment, after performing operation 1007, the processor 340 may perform operation 507 of FIG. 5B. For example, the processor 340 may determine whether it is necessary to correct the first correction value based on the second image data to which the first correction value is applied, and in response to determining that the first correction value needs to be corrected, the processor 340 may determine that a similarity between the first environment information and the second environment information is equal to or greater than a designated value.

Figure 11:
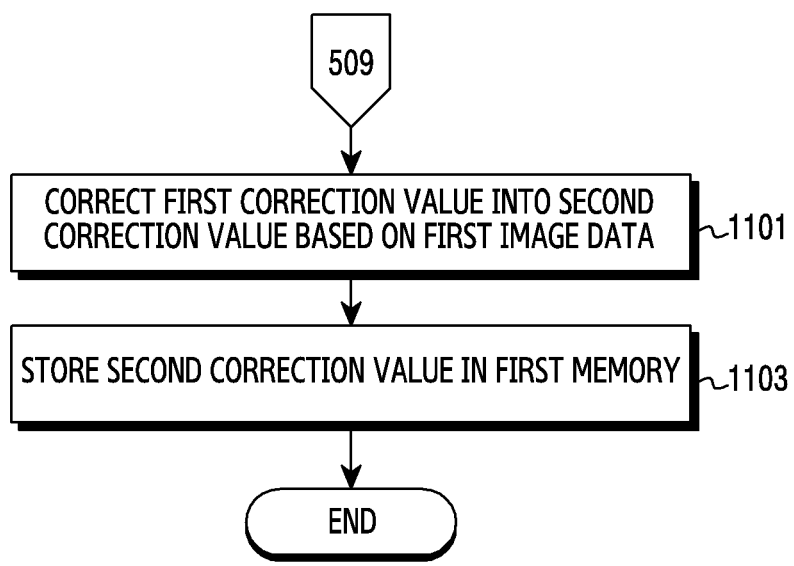
FIG. 11 is a flowchart illustrating an operation in which an electronic device corrects a correction value related to a second camera and then stores the corrected correction value in a first memory according to an embodiment of the disclosure.

FIG. 11 is a flowchart illustrating an operation in which the electronic device 101 corrects a correction value related to the second camera 330 and then stores the corrected correction value in the first memory 360 according to an embodiment of the disclosure. Operations of FIG. 11 may be performed by the processor 340 of FIG. 3.

According to an embodiment, in operation 1101, the processor 340 may correct a first correction value as a second correction value based on first image data. In an embodiment, operation 1101 may correspond to operation 512 of FIG. 5A or operation 511 of FIG. 5B.

According to an embodiment, in operation 1103, the processor 340 may store the second correction value in the first memory 360. The processor 340 may correct the first correction value (e.g., a correction value related to the second camera 330) to the second correction value based on the first image data, and may store the corrected second correction value in the first memory 360. For example, the processor 340 may store a second correction value (e.g., a corrected white balance correction value and a corrected lens shading correction value) in the first memory 360. That is, the processor 340 may update the correction value related to the second camera 330 in the first memory 360.

According to an embodiment, the correction value related to the first camera 310 may be stored in a non-volatile memory (e.g., EEPROM) included in the first camera 310. For example, the non-volatile memory included in the first camera 310 may store a correction value for correcting errors on the assembly process such as an image sensor, an infrared filter, a lens assembly, and a coating layer included in the first camera 310. However, unlike the first camera 310, in the second camera 330 (e.g., an under-display camera), errors caused by the display 320 or errors on the assembly process with the display 320 may occur as well as errors inside the camera module of the second camera 330. Accordingly, the correction value related to the second camera 330 may not be stored in a third memory 332 inside the second camera 330 but in the first memory 360 mounted separately from the second camera 330.

Figure 12A:
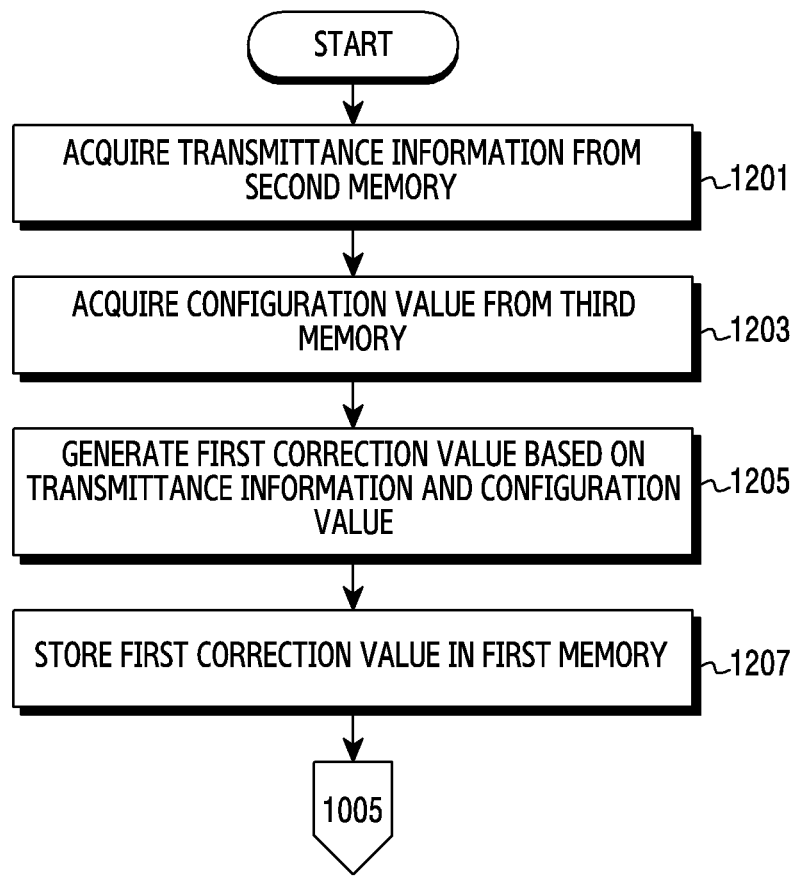
FIG. 12A is a flowchart illustrating an operation of obtaining an initial value of a correction value related to a second camera in an electronic device according to an embodiment of the disclosure.
Figure 12B:
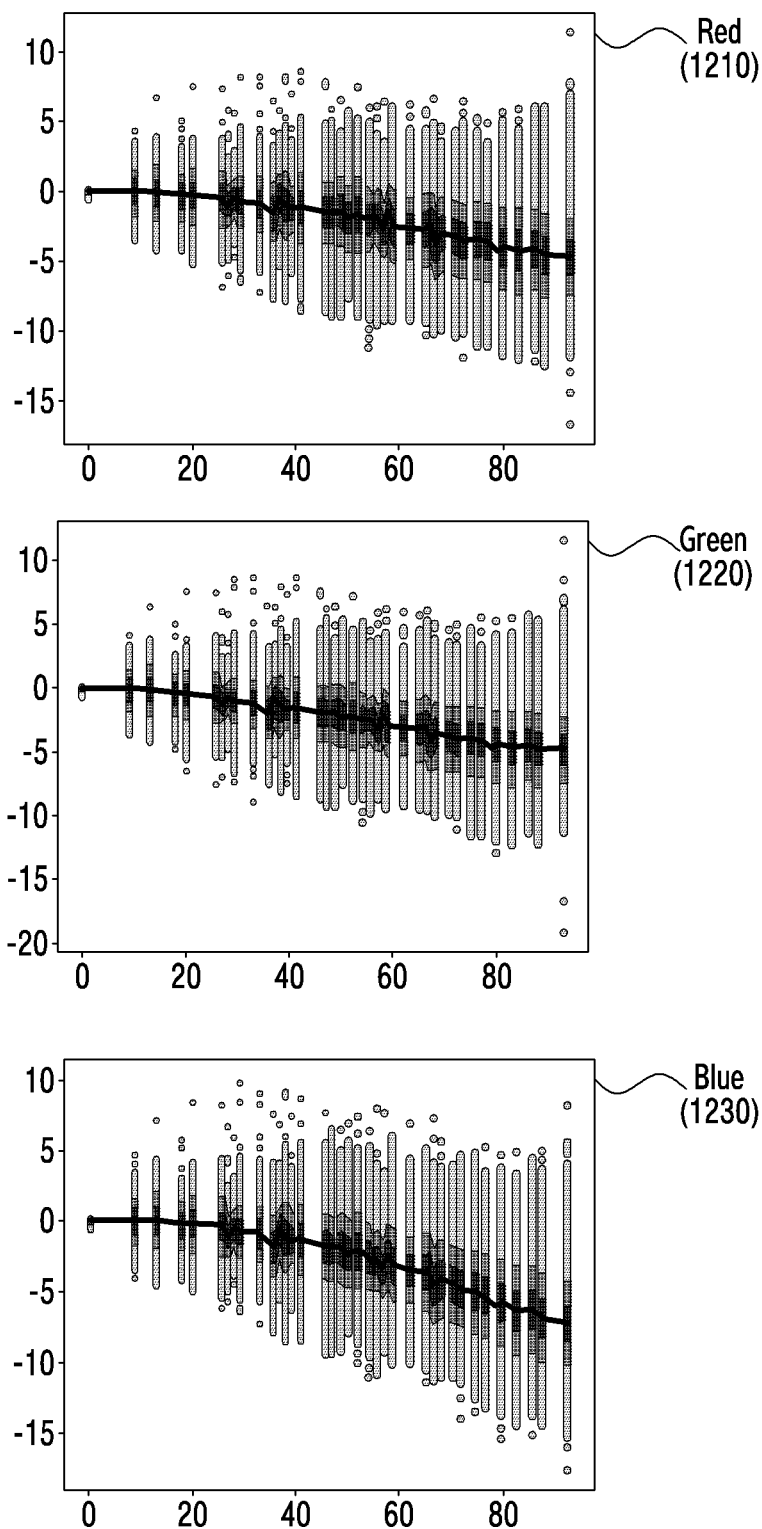
FIG. 12B illustrates an example of transmittance information obtained by an electronic device from a second memory included in a display according to an embodiment of the disclosure.

FIG. 12A is a flowchart illustrating an operation of obtaining an initial value of a correction value related to the second camera 330 in the electronic device 101 according to an embodiment of the disclosure. FIG. 12B illustrates an example of transmittance information obtained by the electronic device 101 from a second memory 322 included in the display 320 according to an embodiment of the disclosure. Operations of FIG. 12A may be performed by the processor 340 of FIG. 3.

According to an embodiment, the display 320 may include the second memory 322 that stores transmittance information with respect to a ratio of light passing through the display 320.

According to an embodiment, the second camera 330 may include a third memory 332 that stores a configuration value related to light that does not pass through the display 320. For example, the configuration value may refer to a configuration value required by a camera module in a state not coupled to the display 320. The configuration value may include at least one of a white balance correction value or a lens shading correction value.

According to an embodiment, in operation 1201, the processor 340 may acquire the transmittance information from the second memory 322 included in the display 320.

According to an embodiment, in operation 1203, the processor 340 may acquire a configuration value related to the light that does not pass through the display 320 from the third memory 332 included in the second camera 330.

According to an embodiment, in operation 1205, the processor 340 may generate a first correction value based on the transmittance information and the configuration value. The processor 340 may generate a first white balance correction value and a first lens shading correction value included in the first correction value based on the transmittance information and the configuration value.

According to an embodiment, the processor 340 may acquire a quantum efficiency (QE) for each wavelength of an image sensor included in the second camera 330 based on the configuration value acquired from the third memory 332 of the second camera 330. The processor 340 may generate a first white balance correction value for a reference light source having various color temperatures (e.g., 3100K, 5100K, 6100K) based on a correlation between the acquired data on the QE for each wavelength and the transmittance information of the display 320. In addition, the processor 340 may generate a first lens shading correction value based on a result of comparing information related to lens shading among the configuration values acquired from the third memory 332 of the second camera 330 with a reference shading profile.

FIG. 12B illustrates an example of a correlation between a configuration value stored in the third memory 332 included in the second camera 330 and a first correction value generated based on the configuration value. A graph 1210 shows an amount of red light that is reduced while passing through the display 320 from light incident on the second camera 330, a graph 1220 shows an amount of green light that is reduced while passing through the display 320 from the light incident on the second camera 330, and a graph 1230 shows an amount of blue light that is reduced while passing through the display 320 from the light incident on the second camera 330. Each of the graphs 1210, 1220, and 1230 of FIG. 12B is an example of a distribution of a plurality of display samples, and a portion indicated by a thick solid line refers to an intermediate value of all the samples.

According to an embodiment, in operation 1207, the processor 340 may store the first correction value in the first memory 360. The processor 340 may perform operation 1005 of FIG. 10 using the first correction value stored in the first memory 360. The first correction values of operations 1205 and 1207 may be included in the first correction value described in operation 1005 of FIG. 10. For example, when resetting a correction value related to the second camera 330 due to replacement of parts of the electronic device 101, the processor 340 may acquire an initial value of the correction value related to the second camera 330 through operations of FIG. 12A to store the acquired value in the first memory 360.

According to an embodiment, the initial value described in FIG. 12A may refer to an initial value newly configured when the correction value related to the second camera 330 is reset, but in another embodiment, the processor 340 may perform calibration on the second image data acquired through the second camera 330 based on the first correction value acquired in FIG. 12A. That is, even if the processor 340 does not use the first image data acquired through the first camera 310, the processor 340 may correct white balance and/or lens shading of the image data acquired through the second camera 330 based on the first correction value acquired in FIG. 12A.

An electronic device according to an embodiment may include a first camera, a display, a second camera disposed below the display to acquire an image of light passing through the display, and at least one processor electrically connected to the first camera, the display, and the second camera. The at least one processor may be configured to acquire first image data and first environment information associated with the first image data by using the first camera, acquire second image data and second environment information associated with the second image data by using the second camera, determine whether to correct a correction value related to the second camera based on the second image data, the correction value including at least one of a white balance correction value for correcting white balance of the second camera or a lens shading correction value for correcting lens shading of the second camera, identify a similarity between the first environment information and the second environment information in response to determining to correct the correction value related to the second camera, and correct the correction value related to the second camera by using at least the similarity based on the first image data.

In the electronic device according to an embodiment, the at least one processor may be further configured to determine whether the similarity between the first environment information and the second environment information is equal to or greater than a designated value, and correct the correction value related to the second camera based on the first image data in response to determining that the similarity is equal to or greater than the designated value.

The electronic device according to an embodiment may further include a sensor electrically connected to the at least one processor, wherein the at least one processor may be further configured to further acquire the first environment information and the second environment information by using the sensor, and the first environment information may include at least one of illuminance, a color temperature, an amount of infrared light, or location information on a location of the electronic device when the first image data is acquired and the second environment information may include at least one of illuminance, a color temperature, an amount of infrared light, or location information on a location of the electronic device when the second image data is acquired.

In the electronic device according to an embodiment, the first camera and the second camera may be arranged in the electronic device to face a same direction, and the at least one processor may be further configured to activate the first camera and the second camera to acquire the first image data, the first environment information, the second image data, and the second environment information, determine whether to correct the white balance correction value related to the second camera based on a result of comparing color information of the first image data with color information of the second image data, determine whether to correct the lens shading correction value related to the second camera based on a result of comparing a shading profile of the first image data with a shading profile of the second image data, and determine that the similarity between the first environment information and the second environment information is equal to or greater than the designated value.

In the electronic device according to an embodiment, the first camera and the second camera may be arranged in the electronic device to face a different direction from each other, and the at least one processor may be further configured to acquire the first image data and the first environment information at a first time point by using the first camera, acquire third image data and third environment information associated with the third image data at a second time point different from the first time point by using the first camera, and identify a first similarity between the first environment information and the second environment information and a second similarity between the third environment information and the second environment information.

In the electronic device according to an embodiment, the at least one processor may be further configured to correct the correction value related to the second camera based on the first image data in response to determining that the first similarity is equal to or greater than the designated value and the second similarity is less than the designated value.

In the electronic device according to an embodiment, the at least one processor may be further configured to identify a greater similarity between the first similarity and the second similarity in response to determining both the first similarity and the second similarity are equal to or greater than the designated value, and correct the correction value related to the second camera based on the first image data in response to determining that the first similarity is greater than the second similarity.

In the electronic device according to an embodiment, the at least one processor may be configured to acquire an image frame by using the second camera, determine whether to correct the correction value related to the second camera based on the image frame, display a user interface (UI) associated with the correction of the correction value on the display in response to determining to correct the correction value, the UI including a guidance for inducing a user's behavior in relation to the correction of the correction value, acquire the first image data satisfying a first condition according to the guidance by using the first camera, and acquire the second image data satisfying a second condition according to the guidance by using the second camera.

In the electronic device according to an embodiment, the at least one processor may be further configured to determine to correct the correction value related to the second camera in response to receiving a user input.

The electronic device according to an embodiment may further include a first memory electrically connected to the at least one processor, wherein the at least one processor may be further configured to acquire the second image data from the second camera, apply a first correction value stored in the first memory to the second image data, the first correction value corresponding to the correction value related to the second camera, determine whether to correct the first correction value based on the second image data to which the first correction value is applied, correct the first correction value to a second correction value based on the first image data in response to determining that the similarity between the first environment information and the second environment information is equal to or greater than a designated value, and store the second correction value in the first memory.

In the electronic device according to an embodiment, the display may include a second memory configured to store transmittance information on a ratio of light passing through the display, the second camera may include a third memory configured to store a configuration value associated with light that does not pass through the display, and the at least one processor may further be configured to acquire the transmittance information from the second memory, acquire the configuration value from the third memory, generate the first correction value based on the transmittance information and the configuration value, and store the first correction value in the first memory.

A method performed by an electronic device according to an embodiment may include acquiring first image data and first environment information associated with the first image data by using a first camera of the electronic device, acquiring second image data and second environment information associated with the second image data by using a second camera of the electronic device that is disposed below a display of the electronic device to acquire an image of light passing through the display, determining whether to correct a correction value related to the second camera based on the second image data, the correction value including at least one of a white balance correction value for correcting white balance of the second camera or a lens shading correction value for correcting lens shading of the second camera, determining whether a similarity between the first environment information and the second environment information is equal to or greater than a designated value in response to determining to correct the correction value related to the second camera, and correcting the correction value related to the second camera based on the first image data by using at least the similarity in response to determining that the similarity is equal to or greater than the designated value.

In the method of operating the electronic device according to an embodiment, the acquiring of the first image data and the second image data may include acquiring an image frame by using the second camera, determining whether correct the correction value related to the second camera based on the image frame, displaying a UI associated with the correction of the correction value on the display in response to determining to correct the correction value, the UI including a guidance for inducing a user's behavior in relation to the correction of the correction value, acquiring the first image data satisfying a first condition according to the guidance by using the first camera, and acquiring the second image data satisfying a second condition according to the guidance by using the second camera.

In the method of operating the electronic device according to an embodiment, the determining of whether to correct the correction value related to the second camera based on the second image data may include acquiring the second image data from the second camera, applying the correction value stored in a first memory of the electronic device to the second image data, and determining whether to correct the correction value based on the second image data to which the correction value is applied.

In the method of operating the electronic device according to an embodiment, the correcting of the correction value related to the second camera based on the first image data may include correcting a first correction value corresponding to the correction value related to the second camera into a second correction value based on the first image data, and storing the second correction value in a first memory of the electronic device.

An electronic device according to an embodiment may include a first camera, a display, a second camera disposed below the display and configured to acquire an image of light passing through the display, and at least one processor electrically connected to the first camera, the display, and the second camera. The at least one processor may be configured to acquire an image frame by using the second camera, determine whether to correct a correction value related to the second camera based on the image frame, the correction value including at least one of a white balance correction value for correcting white balance of the second camera or a lens shading correction value for correcting lens shading of the second camera, display a UI associated with the correction of the correction value on the display in response to determining to correct the correction value, acquire first image data satisfying a designated condition and first environment information associated with the first image data by using the first camera, acquire second image data satisfying a designated condition and second environment information associated with the second image data by using the second camera, and correct the correction value related to the second camera based on a result of comparing the first image data with the second image data.

In the electronic device according to an embodiment, the at least one processor may be further configured to correct the white balance correction value related to the second camera based on a result of comparing color information of the first image data with color information of the second image data.

In the electronic device according to an embodiment, the color information of the first image data may include a first hue-saturation map (HS map) of the first image data, and the color information of the second image data may include a second HS map of the second image data.

In the electronic device according to an embodiment, the at least one processor may be further configured to correct the lens shading correction value related to the second camera based on a result of comparing a first shading profile of the first image data with a second shading profile of the second image data.

In the electronic device according to an embodiment, the UI associated with the correction of the correction value may include a guidance for inducing a user's behavior in relation to the correction of the correction value.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a first camera;
a display;
a second camera disposed below the display and configured to acquire an image of light passing through the display; and
at least one processor electrically connected to the first camera, the display, and the second camera, wherein the at least one processor is configured to:
acquire first image data and first environment information associated with the first image data by using the first camera, acquire second image data and second environment information associated with the second image data by using the second camera, determine whether to correct a correction value related to the second camera based on image data output from the second camera, the correction value including at least one of a white balance correction value for correcting white balance of the second camera or a lens shading correction value for correcting lens shading of the second camera, in response to determining to correct the correction value related to the second camera, identify a similarity between the first environment information and the second environment information, and correct the correction value related to the second camera by using at least the similarity based on the first image data.

2. The electronic device of claim 1, wherein the at least one processor is further configured to:

determine whether the similarity between the first environment information and the second environment information is equal to or greater than a designated value, and correct the correction value related to the second camera based on the first image data in response to determining that the similarity is equal to or greater than the designated value.

3. The electronic device of claim 1, further comprising:

a sensor electrically connected to the at least one processor, wherein the at least one processor is further configured to acquire the first environment information and the second environment information by using the sensor, wherein the first environment information includes at least one of illuminance, a color temperature, an amount of infrared light, or location information on a location of the electronic device when the first image data is acquired, and wherein the second environment information includes at least one of illuminance, a color temperature, an amount of infrared light, or location information on a location of the electronic device when the second image data is acquired.

4. The electronic device of claim 1, wherein the first camera and the second camera are disposed in the electronic device to face a same direction, wherein the image data output from the second camera comprises the second image data, and wherein the at least one processor is further configured to:

activate the first camera and the second camera to acquire the first image data, the first environment information, the second image data, and the second environment information, determine whether to correct the white balance correction value related to the second camera based on a result of comparing color information of the first image data with color information of the second image data, and determine whether to correct the lens shading correction value related to the second camera based on a result of comparing a shading profile of the first image data with a shading profile of the second image data.

5. The electronic device of claim 2, wherein the first camera and the second camera are disposed in the electronic device to face a different direction from each other, and wherein the at least one processor is further configured to:

acquire the first image data and the first environment information at a first time point by using the first camera, acquire third image data and third environment information associated with the third image data at a second time point different from the first time point by using the first camera, and identify a first similarity between the first environment information and the second environment information and a second similarity between the third environment information and the second environment information.

6. The electronic device of claim 5, wherein the at least one processor is further configured to correct the correction value related to the second camera based on the first image data in response to determining that the first similarity is equal to or greater than the designated value and the second similarity is less than the designated value.

7. The electronic device of claim 5, wherein the at least one processor is further configured to:

identify a greater similarity between the first similarity and the second similarity in response to determining both the first similarity and the second similarity are equal to or greater than the designated value, and correct the correction value related to the second camera based on the first image data in response to determining that the first similarity is greater than the second similarity.

8. The electronic device of claim 1, wherein the image data output from the second camera comprises an image frame, and wherein the at least one processor is further configured to:

acquire the image frame by using the second camera, determine whether to correct the correction value related to the second camera based on the image frame, display a user interface (UI) associated with the correction of the correction value on the display in response to determining to correct the correction value, the UI including a guidance for inducing a user's behavior in relation to the correction of the correction value, acquire the first image data satisfying a first condition according to the guidance by using the first camera, and acquire the second image data satisfying a second condition according to the guidance by using the second camera.

9. The electronic device of claim 8, wherein the at least one processor is further configured to determine to correct the correction value related to the second camera in response to receiving a user input.

10. The electronic device of claim 1, further comprising:

a first memory electrically connected to the at least one processor, wherein the image data output from the second camera comprises the second image data, and wherein the at least one processor is further configured to:

acquire the second image data from the second camera, apply a first correction value stored in the first memory to the second image data, the first correction value corresponding to the correction value related to the second camera, determine whether to correct the first correction value based on the second image data to which the first correction value is applied, correct the first correction value to a second correction value based on the first image data in response to determining that the similarity between the first environment information and the second environment information is equal to or greater than a designated value, and store the second correction value in the first memory.

11. The electronic device of claim 10, wherein the display includes a second memory configured to store transmittance information on a ratio of light passing through the display, wherein the second camera includes a third memory configured to store a configuration value associated with light that does not pass through the display, and wherein the at least one processor is further configured to:
acquire the transmittance information from the second memory,
acquire the configuration value from the third memory,
generate the first correction value based on the transmittance information and the configuration value, and
store the first correction value in the first memory.

12. The electronic device of claim 10, wherein the determining of whether to correct the correction value related to the second camera based on the image data output from the second camera comprises determining whether it is necessary to correct the correction value.

13. A method performed by an electronic device, the method comprising:

acquiring first image data and first environment information associated with the first image data by using a first camera of the electronic device;

acquiring second image data and second environment information associated with the second image data by using a second camera of the electronic device that is disposed below a display of the electronic device to acquire an image of light passing through the display;

determining whether to correct a correction value related to the second camera based on image data output from the second camera, the correction value including at least one of a white balance correction value for correcting white balance of the second camera or a lens shading correction value for correcting lens shading of the second camera;

in response to determining to correct the correction value related to the second camera, determining whether a similarity between the first environment information and the second environment information is equal to or greater than a designated value; and correcting the correction value related to the second camera based on the first image data by using at least the similarity in response to determining that the similarity is equal to or greater than the designated value.

14. The method of claim 13, wherein the image data output from the second camera comprises an image frame, wherein the determining of whether to correct the correction values related to the second camera includes determining whether to correct the correction value related to the second camera based on the image frame, wherein the method further comprises:
acquiring the image frame by using the second camera; and displaying a user interface (UI) associated with the correction of the correction value on the display in response to determining to correct the correction value, the UI including a guidance for inducing a user's behavior in relation to the correction of the correction value, and wherein the acquiring of the first image data and the second image data includes:
acquiring the first image data satisfying a first condition according to the guidance by using the first camera; and
acquiring the second image data satisfying a second condition according to the guidance by using the second camera.

15. The method of claim 13, wherein the image data output from the second camera comprises the second image data, and wherein the determining of whether to correct the correction value related to the second camera based on the image data output from the second camera includes:
acquiring the second image data from the second camera;
applying the correction value stored in a first memory of the electronic device to the second image data; and
determining whether to correct the correction value based on the second image data to which the correction value is applied.

16. The method of claim 13, wherein the correcting of the correction value related to the second camera based on the first image data includes:

correcting a first correction value corresponding to the correction value related to the second camera into a second correction value based on the first image data, and storing the second correction value in a first memory of the electronic device.

17. The method of claim 13, wherein the determining of whether to correct the correction value related to the second camera based on the image data output from the second camera comprises determining whether it is necessary to correct the correction value.

18. An electronic device comprising:

a first camera;

a display;

a second camera disposed below the display and configured to acquire an image of light passing through the display; and at least one processor electrically connected to the first camera, the display, and the second camera, wherein the at least one processor is configured to:
acquire an image frame by using the second camera,
determine whether to correct a correction value related to the second camera based on the image frame, the correction value including at least one of a white balance correction value for correcting white balance of the second camera or a lens shading correction value for correcting lens shading of the second camera,
display a user interface (UI) associated with the correction of the correction value on the display in response to determining to correct the correction value,
acquire first image data satisfying a designated condition and first environment information associated with the first image data by using the first camera, acquire second image data satisfying a designated condition and second environment information associated with the second image data by using the second camera, and correct the correction value related to the second camera based on a result of comparing the first image data with the second image data.

19. The electronic device of claim 18, wherein the at least one processor is further configured to correct the white balance correction value related to the second camera based on a result of comparing color information of the first image data with color information of the second image data.

20. The electronic device of claim 19,
wherein the color information of the first image data includes a first hue-saturation map (HS map) of the first image data, and
wherein the color information of the second image data includes a second HS map of the second image data.

21. The electronic device of claim 18, wherein the at least one processor is further configured to correct the lens shading correction value related to the second camera based on a result of comparing a first shading profile of the first image data with a second shading profile of the second image data.

22. The electronic device of claim 18, wherein the UI associated with the correction of the correction value may include a guidance for inducing a user's behavior in relation to the correction of the correction value.

23. The electronic device of claim 18, wherein the determining of whether to correct the correction value related to the second camera based on the image frame comprises determining whether it is necessary to correct the correction value.

* * * * *